United States Patent
Eroz et al.

(10) Patent No.: US 7,673,226 B2
(45) Date of Patent: *Mar. 2, 2010

(54) METHOD AND SYSTEM FOR PROVIDING SHORT BLOCK LENGTH LOW DENSITY PARITY CHECK (LDPC) CODES

(75) Inventors: Mustafa Eroz, Germantown, MD (US); Feng-Wen Sun, Germantown, MD (US); Lin-Nan Lee, Potomac, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 11/937,997

(22) Filed: Nov. 9, 2007

(65) Prior Publication Data

US 2008/0082894 A1    Apr. 3, 2008

Related U.S. Application Data

(63) Continuation of application No. 10/930,298, filed on Aug. 31, 2004, now Pat. No. 7,334,181.

(60) Provisional application No. 60/500,109, filed on Sep. 4, 2003, provisional application No. 60/514,683, filed on Oct. 27, 2003, provisional application No. 60/518,199, filed on Nov. 7, 2003.

(51) Int. Cl.
G06F 11/00    (2006.01)

(52) U.S. Cl. .................. 714/801; 714/755; 714/786

(58) Field of Classification Search .................. 714/755, 714/786, 801

See application file for complete search history.

(56) References Cited

U.S. PATENT DOCUMENTS

| | | | |
|---|---|---|---|
| 6,829,308 B2 | 12/2004 | Eroz et al. | |
| 6,895,547 B2 | 5/2005 | Eleftheriou et al. | |
| 7,000,168 B2 | 2/2006 | Kurtas et al. | |
| 7,020,829 B2 | 3/2006 | Eroz et al. | |
| 2002/0051501 A1 | 5/2002 | Demjanenko et al. | |
| 2004/0019845 A1 | 1/2004 | Eroz et al. | |
| 2004/0054960 A1 | 3/2004 | Eroz et al. | |
| 2004/0086059 A1 | 5/2004 | Eroz et al. | |
| 2004/0268205 A1 | 12/2004 | Stolpman | |
| 2005/0063484 A1 | 3/2005 | Eroz et al. | |

(Continued)

FOREIGN PATENT DOCUMENTS

| | | |
|---|---|---|
| CN | 1405981 | 3/2003 |
| JP | 2001-345716 | 12/2001 |
| WO | WO 01/97387 | 12/2001 |

OTHER PUBLICATIONS

Canadian Office Action dated Aug. 4, 2008 in Canadian counterpart Application No. 2579629 corresponding to U.S. Appl. No. 10/930,298, filed Aug. 31, 2004 by Mustafa Eroz et al., now issued Feb. 19, 2008 as US Patent No. 7,334,181.

Notice of Allowance dated Sep. 26, 2008 in U.S. Appl. No. 11/938,071, filed Nov. 9, 2007 by Mustafa Eroz et al.

(Continued)

*Primary Examiner*—Guy J Lamarre
*Assistant Examiner*—Sam Rizk

(57) ABSTRACT

An approach is provided for generating Low Density Parity Check (LDPC) codes. An LDPC encoder generates a short LDPC code by shortening longer mother codes. The short LDPC code has an outer Bose Chaudhuri Hocquenghem (BCH) code. According to another aspect, for an LDPC code with code rate of 3/5 utilizing 8-PSK (Phase Shift Keying) modulation, an interleaver provides for interleaving bits of the output LDPC code by serially writing data associated with the LDPC code column-wise into a table and reading the data row-wise from right to left. The above approach has particular application in digital video broadcast services over satellite.

21 Claims, 9 Drawing Sheets

U.S. PATENT DOCUMENTS

| | | | |
|---|---|---|---|
| 2005/0091565 | A1 | 4/2005 | Eroz et al. |
| 2005/0091570 | A1 | 4/2005 | Eroz et al. |
| 2005/0166133 | A1 | 7/2005 | Eroz et al. |
| 2005/0262424 | A1 | 11/2005 | Tran et al. |
| 2005/0268206 | A1 | 12/2005 | Tran et al. |

OTHER PUBLICATIONS

EPO Communication dated Jan. 20, 2006 in European counterpart application No. 04255344.6 of parent U.S. Appl. No. 10/930,298, filed Aug. 31, 2004.

EPO Communication dated Dec. 13, 2006, in European counterpart application No. 04255344.6 of parent U.S. Appl. No. 10/930,298, filed Aug. 31, 2004.

Chinese Office Communication date Mar. 10, 2006 in Chinese counterpart application No. 200410087494.8 of parent U.S. Appl. No. 10/930,298, filed Aug. 31, 2004.

Chinese Office Communication dated Aug. 24, 2007 in Chinese counterpart application No. 200410087494.8 of parent U.S. Appl. No. 10/930,298, filed Aug. 31, 2004.

Canadian Office Communication dated Nov. 14, 2006 in Canadian counterpart application No. 2480145 of parent U.S. Appl. No. 10/930,298, filed Aug. 31, 2004.

Japanese Office Communication date Jun. 27, 2006 in Japanese counterpart application No. 2004-258552 of parent U.S. Appl. No. 10/930,298, filed Aug. 31, 2004.

Korean Office Communication dated Apr. 24, 2006 in Korean counterpart application No. 10-2004-70508 of parent U.S. Appl. No. 10/930,298, filed Aug. 31, 2004.

EPO Communication dated Oct. 21, 2005 in counterpart European patent application No. 04256629.9 of related U.S. Appl. No. 10/971,509, filed Oct. 22, 2004.

Canadian Office Communication dated Apr. 11, 2007 in counterpart Canadian patent application No. 2486048 of related U.S. Appl. No. 10/971,509, filed Oct. 22, 2004.

Japanese Office Communication dated Jan. 9, 2007 in counterpart Japanese patent application No. 2004-312709 of related U.S. Appl. No. 10/971,509, filed Oct. 22, 2004.

Korean Office Communication dated May 17, 2006 in counterpart Korean patent application No. 10-2004-86317 of related U.S. Appl. No. 10/971,509, filed Oct. 22, 2004.

U.S. Appl. No. 60/482,107, filed Jun. 24, 2003, Eroz et al.

Nieda, Satoshi et al.; "Low-Density Parity-Check Codes for Decoding Algorithm Based on Belief Propagation"; Technical Report of IEICE; IT2003-32; Jul. 2003; The Institute of Electronics, Information and Communication Engineers.

Wadayama, Tadashi; "A Coded Modulation Scheme Based on Low Density Parity Check Codes"; IEICE Trans. Fundamentals; vol. E84-A, No. 10, Oct. 2001; Paper—Special Issue on a Special Issue of IEICE Transactions.

Yi Yu et al.; "Design of Semi-Algebraic Low-Density Parity Check (SA-LDPC) Codes for Multilevel Coded Modulation"; Institute of Information & Communications; Chonbuk National University; ChonJu 561-756, Korea; pp. 931-934; XP-010661473.

Lee, Lin-Nan; "LDPC Codes, Application to Next Generation Communication Systems"; Hughes Network Systems; Germantown, Maryland; .Oct. 8, 2003; pp. 1-8; XP-00231-11763.

Mansour, Mohammad M. et al.; "Low-Power VLSI Decoder Architectures for LDPC Codes"; ICIMS Research Center; ECE Dept., Coordinated Science Laboratory, University of Illinois at Urbana-Champaign, Urbana, IL; pp. 284-289; XP-010600916.

Mansour, Mohommad M. et al.; "Architecture-Aware Low-Density Parity-Check Codes"; Coordinated Science Laboratory, ECE Department University of Illinois at Urbana-Champaign; Urbana, Illinois; pp. 57-60; XP002302868.

Le Goff, S.Y.; "Channel Capacity of Bit-Interleaved Coded Modulation Schemes Using 8-ary Signal Constellations"; Electronics Letters IEE; Stevenage, Great Britain; vol. 38, No. 4; Feb. 14, 2002; pp. 187-189; XP006017828; ISSN: 0013-5194.

Le Goff, S.Y.; "Signal Constellations for Bit-Interleaved Coded Modulation"; IEEE Transactions on Information Theory; vol. 49, No. 1; Jan. 2003; pp. 307-313; XP002322414.

Le Goff, S.Y.; "Signalling Constellations for Power-Efficient Bit-Interleaved Coded Modulation Schemes"; IEEE Proceedings: Communications, Institution of Electrical Engineers; Great Britain; vol. 150, No. 3; Jun. 13, 2003; pp. 141-148; XP006020428; ISSN 1350-2425.

Hou, J.; Siegel, P.H.; Milstein, L.B.; Pfister, H.D.; "Capacity-Approaching Bandwidth-Efficient Coded Modulation Schemes Based on Low- Density Parity-Check Codes"; IEEE Transactions on Information Theory; vol. 49, No. 9; Sep. 1, 2003; pp. 2141-2155; XP002322415.

Calzolari, G.P.; "Report on DVB-S2 Channel Coding Standardization Effort"; Sub-Panel Channel Coding Meeting Report; Matera, Italy; Apr. 7, 2003; pp. 1-11; XP002311762.

Selvarathinam, Anand et al.; "A Massively Scaleable Decoder Architecture for Low-Density Parity-Check Code" Department of Electrical Engineering, Texas A&M University; College Station, Texas; pp. 61-64; XP00226092.

Hocevar, Dale E.; "LDPC Code Construction with Flexible Hardware Implementation"; DSP Solutions R&D Center, Texas Instruments; Dallas, Texas; pp. 2708-2712.

Draft ETSI EN 302 307 V1.1.1.1; "Second Generation Framing Structure, Channel Coding and Modulation Systems for Broadcasting, Interactive Services, News Gathering and Other Broadband Satellite Applications"; European Standard (Telecommunications series); Digital Video Broadcasting (DVB); pp. 1-74.

Eleftheriou, E. and Olcer, S; "Low-Density Parity-Check Codes for Digital Subscriber Lines"; IBM Research, Zurich Research Laboratory; 8803 Ruschlikon, Switzerland; pp. 1752-1757.

Richardson, Tom; Urbanke, Rudiger; "Capacity Approaching Codes, Iterative Decoding Algorithms, and Their Applications, The Renaissance of Gallagher's Low-Density Parity-Check Codes"; Flarion Technologies and EPFL; IEEE Communications Magaine; Aug. 2003; pp. 128-131; XP-001177711.

Richardson, Thomas J.; Urbanke, Rudiger; "Efficient Encoding of Low-Density Parity-Check Codes"; pp. 638, 656; XP-002965294.

ETSI EN 301 790 v1.3.1.; European Standard (Telecommunications Series), Digital Video Broadcasting (DVB); Interaction Channel for Satellite Distribution Systems; pp. 1-110; XP-014003845.

Narayanaswami, Ravi; "Coded Modulation with Low Density Parity Check Codes"; a Thesis submitted to the Office of Graduate Studies of Texas A&M University in partial fulfillment of the requirement for the degree of Master of Science; Jun. 2001; pp. 1-78; XP-002271230.

Yang, Michael; Ryan, William E.; "Lowering the Error-Rate Floors of Moderate-Length High-Rate Irregular LDPC Codes"; Department of Electrical and Compute Engineering, University of Arizona; Tucson, Arizona 85721; p. 237.

Yang, Michael; Li, Yan; Ryan, William E.; "Design of Efficiently Encodable Moderate-Length High-Rate Irregular LDPC Codes"; Department of Electrical and Computer Engineering, University of Arizona; Tucson, Arizona 85721; Sep. 27, 2002; pp. 1415-1424.

Zang, Tong; Parhi, Keshab K.; "Joint Cope and Decoder Design for Implementation-Oriented (3, k)-regular LDPC Codes"; Department of Electrical and Computer Engineering, University of Minnesota; Minneapolis, MN 55455; pp. 1232-1236.

Gallagher, R.G.; "Low Density Parity-Check Codes"; pp. 21-38; XP-000992693.

U.S. Appl. No. 10/971,509, filed Oct. 22, 2004, Mustafa Eroz, Notice of Allowance dated Jan. 4, 2008.

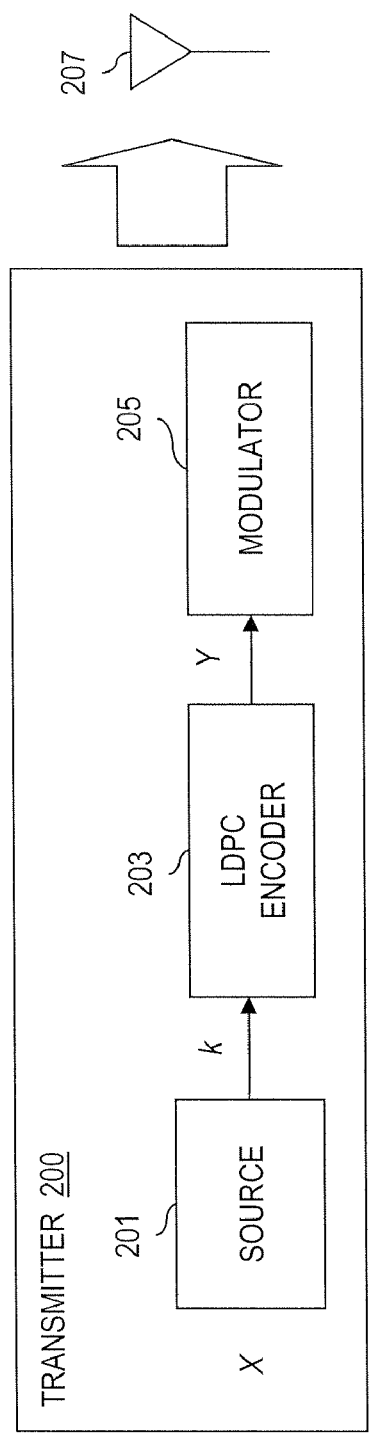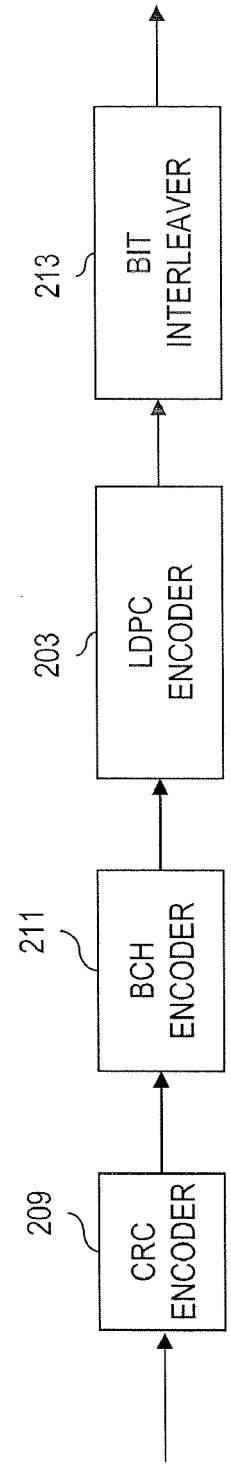

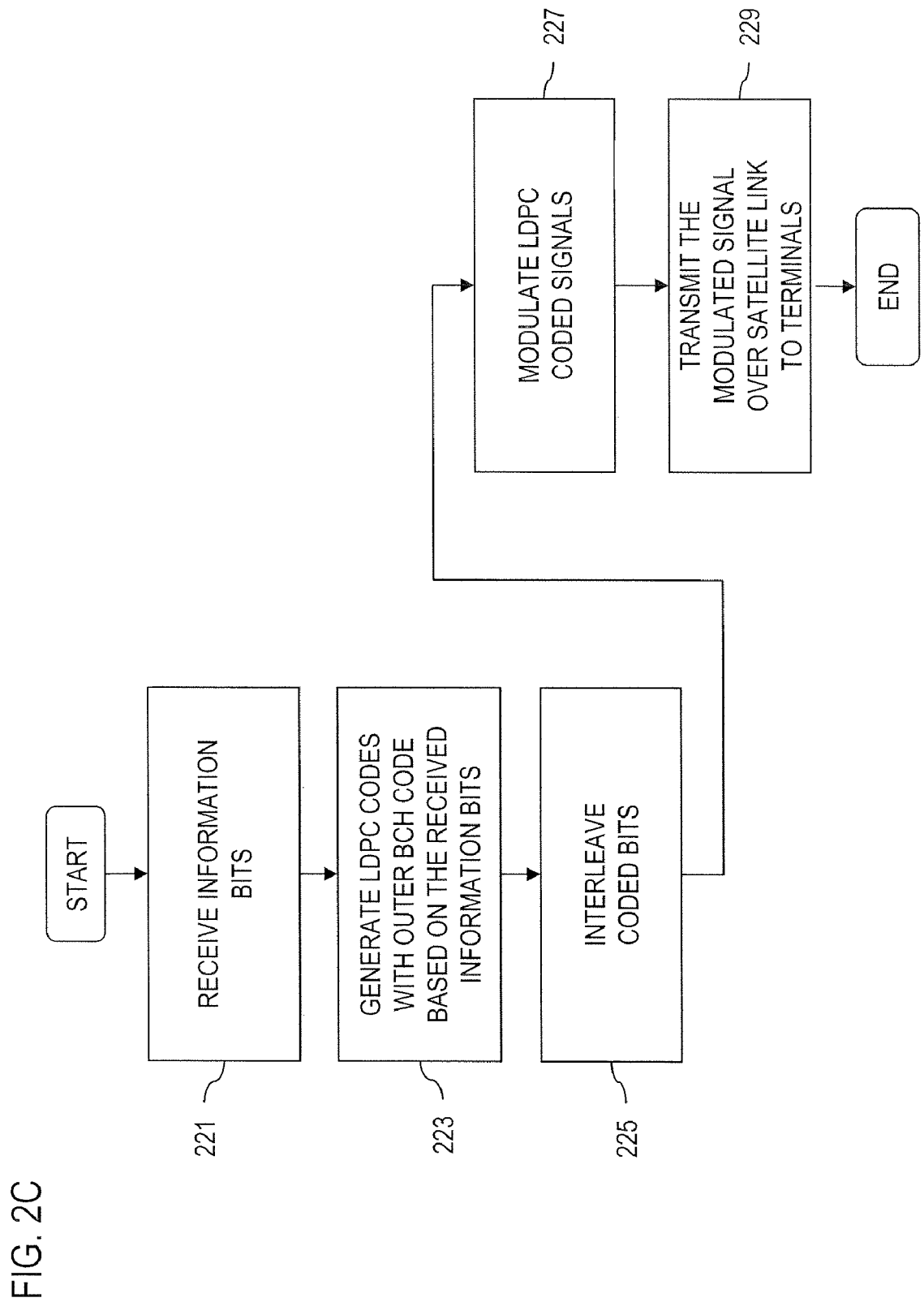

METHOD AND SYSTEM FOR PROVIDING SHORT BLOCK LENGTH LOW DENSITY PARITY CHECK (LDPC) CODES

RELATED APPLICATIONS

This application is a continuation of U.S. patent application Ser. No. 10/930,298, filed Aug. 31, 2004, entitled "Method and System for Providing Short Block Length Low Density Parity Check (LDPC) Codes," which claims the benefit of the earlier filing date under 35 U.S.C. §119(e) of, U.S. Provisional Patent Application (Ser. No. 60/500,109), filed Sep. 4, 2003, entitled "Rate ⅗ 8-PSK and Short Block Length LDPC Codes," U.S. Provisional Application (Ser. No. 60/514,683), filed Oct. 27, 2003, entitled "Rate ⅓ and ¼ LDPC Code," and U.S. Provisional Application (Ser. No. 60/518,199), filed Nov. 7, 2003, entitled "Rate ⅓, ¼ and ⅖ LDPC Code"; the entireties of which are incorporated herein by reference.

FIELD OF THE INVENTION

The present invention relates to communication systems, and more particularly to coded systems.

BACKGROUND OF THE INVENTION

Communication systems employ coding to ensure reliable communication across noisy communication channels. For example, in a wireless (or radio) system, such as a satellite network, noise sources abound, from geographic and environmental factors. These communication channels exhibit a fixed capacity that can be expressed in terms of bits per symbol at certain signal to noise ratio (SNR), defining a theoretical upper limit (known as the Shannon limit). As a result, coding design has aimed to achieve rates approaching this Shannon limit. This objective is particularly germane to bandwidth constrained satellite systems. One such class of codes that approach the Shannon limit is Low Density Parity Check (LDPC) codes.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic.

From an implementation perspective, a number of challenges are confronted. For example, storage is an important reason why LDPC codes have not become widespread in practice. Length LDPC codes, thus, require greater storage space. Also, a key challenge in LDPC code implementation has been how to achieve the connection network between several processing engines (nodes) in the decoder. Further, the computational load in the decoding process, specifically the check node operations, poses a problem.

Therefore, there is a need for an LDPC communication system that employs simple encoding and decoding processes. There is also a need for using LDPC codes efficiently to support high data rates, without introducing greater complexity. There is also a need to improve performance of LDPC encoders and decoders. There is also a need to minimize storage requirements for implementing LDPC coding.

SUMMARY OF THE INVENTION

These and other needs are addressed by the present invention, wherein an approach for encoding Low Density Parity Check (LDPC) codes is provided. An encoder generates a LDPC code having an outer Bose Chaudhuri Hocquenghem (BCH) code according to one of Tables 2-8 for transmission as the LDPC coded signal. Each of the Tables 2-8 specifies the address of parity bit accumulators. Short LDPC codes are output by utilizing LDPC mother codes that are based on Tables 2-8. $k_{ldpc}$ of the BCH encoded bits are preceded by $k_m - k_{ldpc}$ dummy zeros. The resulting $k_m$ bits are systematically encoded to generate $n_m$ bits. The first $k_m - k_{ldpc}$ dummy zeros are then deleted to yield the shortened code. For an LDPC code with code rate of ⅗ utilizing 8-PSK (Phase Shift Keying) modulation, an interleaver provides for interleaving bits of the output LDPC code by serially writing data associated with the LDPC code column-wise into a table and reading the data row-wise from right to left. The approach advantageously provides expedient encoding as well as decoding of LDPC codes, while minimizing storage and processing resources.

According to one aspect of an embodiment of the present invention, a method for supporting transmission of a Low Density Parity Check (LDPC) coded signal is disclosed. The method includes receiving information bits. The method also includes generating, based on the information bits, 16,000 Low Density Parity Check (LDPC) coded bits according a parity check matrix of short LDPC codes, wherein the parity check matrix ensures that information regarding partitioned groups of bit nodes and check nodes are always placed contiguously in Random Access Memory (RAM).

According to another aspect of an embodiment of the present invention, the LDPC codes are represented by signals that are modulated according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

According to yet another aspect of an embodiment of the present invention, the modulated LDPC coded signal is transmitted over a satellite link in support of a broadband satellite application.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 2A and 2B are diagrams of exemplary LDPC encoders deployed in the transmitter of FIG. 1;

FIGS. 2C and 2D are flowcharts of the encoding process of the LDPC encoder of FIG. 2B for generating short frame length LDPC codes, according to an embodiment of the present invention;

DESCRIPTION OF THE PREFERRED EMBODIMENT

A system, method, and software for efficiently encoding short frame length Low Density Parity Check (LDPC) codes are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Figure 1:
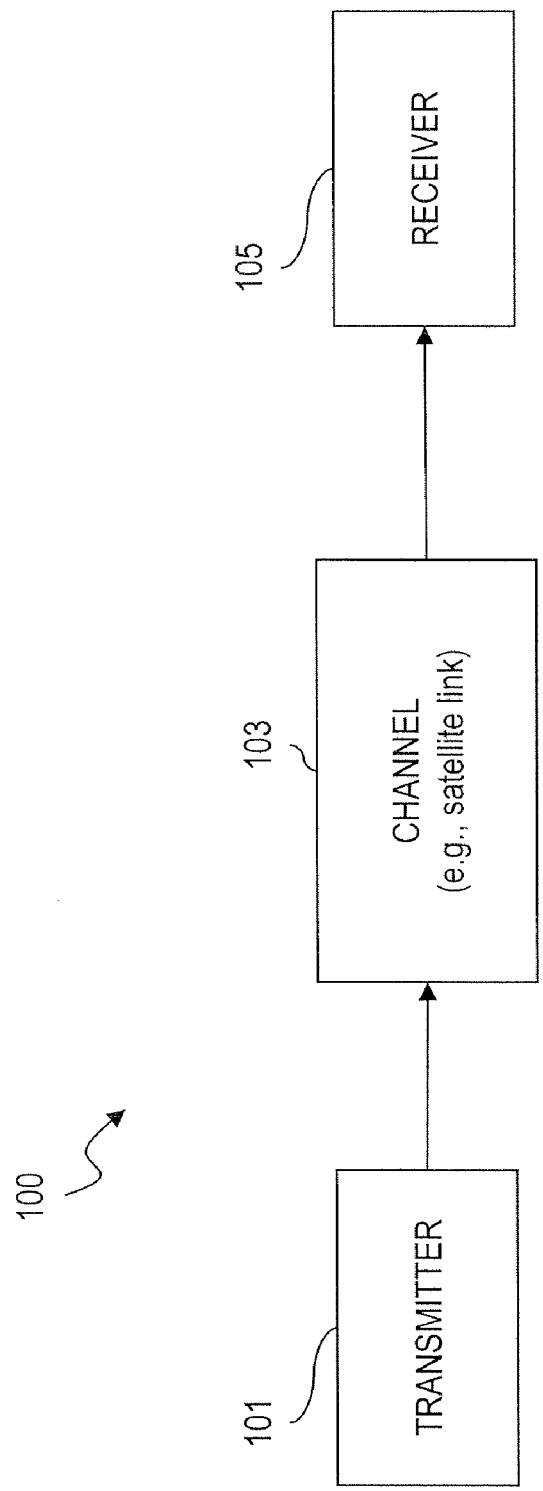
FIG. 1 is a diagram of a communications system configured to utilize Low Density Parity Check (LDPC) codes, according to an embodiment of the present invention.

FIG. 1 is a diagram of a communications system configured to utilize Low Density Parity Check (LDPC) codes, according to an embodiment of the present invention. A digital communications system 100 includes a transmitter 101 that generates signal waveforms across a communication channel 103 to a receiver 105. In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, LDPC codes are utilized.

By way of example, the channel 103 is a satellite link serving satellite terminals (e.g., Very Small Aperture Terminals (VSATs)) in support of broadband satellite applications. Such applications include satellite broadcasting and interactive services (and compliant with the Digital Video Broadcast (DVB)—S2 standard). The Digital Video Broadcasting via Satellite (DVB-S) standard has been widely adopted worldwide to provide, for instance, digital satellite television programming.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme (e.g., 8-PSK).

Such LDPC codes have a parallelizable decoding algorithm (unlike turbo codes), which advantageously involves simple operations such as addition, comparison and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

FIGS. 2A and 2B are diagrams of exemplary LDPC encoders deployed in the transmitter of FIG. 1. As seen in FIG. 2A, a transmitter 200 is equipped with an LDPC encoder 203 that accepts input from an information source 201 and outputs coded stream of higher redundancy suitable for error correction processing at the receiver 105. The information source 201 generates k signals from a discrete alphabet, X. LDPC codes are specified with parity check matrices. On the other hand, encoding LDPC codes require, in general, specifying the generator matrices. Even though it is possible to obtain generator matrices from parity check matrices using Gaussian elimination, the resulting matrix is no longer sparse and storing a large generator matrix can be complex.

The encoder 203 generates signals from alphabet Y to a modulator 205 using a simple encoding technique that makes use of only the parity check matrix by imposing structure onto the parity check matrix. Specifically, a restriction is placed on the parity check matrix by constraining certain portion of the matrix to be triangular. The construction of such a parity check matrix is described more fully below in FIG. 6. Such a restriction results in negligible performance loss, and therefore, constitutes an attractive trade-off.

The modulator 205 maps the encoded messages from encoder 203 to signal waveforms that are transmitted to a transmit antenna 207, which emits these waveforms over the communication channel 103. Accordingly, the encoded messages are modulated and distributed to a transmit antenna 207. The transmissions from the transmit antenna 207 propagate to a receiver (shown in FIG. 3), as discussed below.

FIG. 2B shows an LDPC encoder utilized with a Bose Chaudhuri Hocquenghem (BCH) encoder and a cyclic redundancy check (CRC) encoder, according to one embodiment of the present invention. Under this scenario, the codes generated by the LDPC encoder 203, along with the CRC encoder 209 and the BCH encoder 211, have a concatenated outer BCH code and inner low density parity check (LDPC) code. Furthermore, error detection is achieved using cyclic redundancy check (CRC) codes. The CRC encoder 209, in an exemplary embodiment, encodes using an 8-bit CRC code with generator polynomial $(x^5+x^4+x^3+x^2+1)(x^2+x+1)(x+1)$. The CRC code is output to the BCH encoder 211.

The LDPC encoder 203 systematically encodes an information block of size $k_{ldpc}$, $i=(i_0, i_1, \ldots, i_{k_{ldpc}-1})$ onto a codeword of size $n_{ldpc}$, $c=(i_0, i_1, \ldots, i_{k_{ldpc}-1}, p_0, p_1, \ldots, p_{n_{ldpc}-k_{ldpc}-1})$ The transmission of the codeword starts in the given order from $i_0$ and ends with $p_{n_{ldpc}-k_{ldpc}-1}$. LDPC code parameters $(n_{ldpc}, k_{ldpc})$ are given in Table 1 below.

TABLE 1

LDPC Code Parameters $(n_{ldpc}, k_{ldpc})$

| Code Rate | LDPC Uncoded Block Length $k_{ldpc}$ | LDPC Coded Block Length $n_{ldpc}$ |
|---|---|---|
| 1/2 | 32400 | 64800 |
| 2/3 | 43200 | 64800 |
| 3/4 | 48600 | 64800 |
| 4/5 | 51840 | 64800 |
| 5/6 | 54000 | 64800 |
| 3/5 | 38880 | 64800 |
| 8/9 | 57600 | 64800 |

The task of the LDPC encoder 203 is to determine $n_{ldpc}-k_{ldpc}$ parity bits $(p_0, p_1, \ldots, p_{n_{ldpc}-k_{ldpc}-1})$ for every block of $k_{ldpc}$ information bits, $(i_0, i_1, \ldots, i_{k_{ldpc}-1})$. The procedure is as follows. First, the parity bits are initialized; $p_0 = P_1 = p_2 = \ldots = p_{n_{ldpc}-k_{ldpc}-1} = 0$. The first information bit, $i_0$, are accumulated at parity bit addresses specified in the first row of Tables 2-8. For example, for rate 2/3 (Table 4), the following results:

$p_0 = p_0 \oplus i_0$ $p_{10491} = p_{10491} \oplus i_0$ $p_{16043} = p_{16043} \oplus i_0$ $p_{506} = p_{506} \oplus i_0$ $p_{12826} = p_{12826} \oplus i_0$ $p_{8065} = p_{8065} \oplus i_0$ $p_{8226} = p_{8226} \oplus i_0$ $p_{2767} = p_{2767} \oplus i_0$ $p_{240} = p_{240} \oplus i_0$ $p_{18673} = p_{18673} \oplus i_0$ $p_{9279} = p_{9279} \oplus i_0$ $p_{10579} = p_{10579} \oplus i_0$ $p_{20928} = p_{20928} \oplus i_0$ (All additions are in GF(2)).

Then, for the next 359 information bits, $i_m$, m=1, 2, ..., 359, these bits are accumulated at parity bit addresses $\{x+m \bmod 360 \times q\} \bmod(n_{ldpc}-k_{ldpc})$, where x denotes the address of the parity bit accumulator corresponding to the first bit $i_0$, and q is a code rate dependent constant specified in Table 9. Continuing with the example, q=60 for rate 2/3. By way of example, for information bit $i_1$, the following operations are performed:

$p_{60} = p_{60} \oplus i_1$ $p_{10551} = p_{10551} \oplus i_1$ $p_{16103} = p_{16103} \oplus i_1$ $p_{566} = p_{566} \oplus i_1$ $p_{12886} = p_{12886} \oplus i_1$ $p_{8125} = p_{8125} \oplus i_1$ $p_{8286} = p_{8286} \oplus i_1$ $p_{2827} = p_{2827} \oplus i_1$ $p_{300} = p_{300} \oplus i_1$ $p_{18433} = p_{18733} \oplus i_1$ $p_{9339} = p_{9339} \oplus i_1$ $p_{10639} = p_{10639} \oplus i_1$ $p_{20988} = p_{20988} \oplus i_1$ For the $361^{st}$ information bit $i_{360}$, the addresses of the parity bit accumulators are given in the second row of the Tables 2-8. In a similar manner the addresses of the parity bit accumulators for the following 359 information bits $i_m$, m=361, 362, ..., 719 are obtained using the formula $\{x+m \bmod 360 \times q\} \bmod(n_{ldpc}-k_{ldpc})$, where x denotes the address of the parity bit accumulator corresponding to the information bit $i_{360}$, i.e., the entries in the second row of the Tables 2-8. In a similar manner, for every group of 360 new information bits, a new row from Tables 2-8 are used to find the addresses of the parity bit accumulators.

Addresses of parity bit accumulators are given in Tables 2-8.

TABLE 2

Address of Parity Bit Accumulators (Rate ½)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

TABLE 3

Address of Parity Bit Accumulators (Rate ⅗)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

TABLE 4

Address of Parity Bit Accumulators (Rate ⅔)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350

TABLE 4-continued

Address of Parity Bit Accumulators (Rate ⅔)

3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

TABLE 5

Address of Parity Bit Accumulators (Rate ¾)

3 3198 478 4207 1481 1009 2616 1924 3437 554 683 1801
4 2681 2135
5 3107 4027
6 2637 3373
7 3830 3449
8 4129 2060
9 4184 2742
10 3946 1070
11 2239 984
0 1458 3031
1 3003 1328
2 1137 1716
3 132 3725
4 1817 638
5 1774 3447
6 3632 1257
7 542 3694
8 1015 1945
9 1948 412
10 995 2238
11 4141 1907
0 2480 3079
1 3021 1088
2 713 1379
3 997 3903
4 2323 3361
5 1110 986
6 2532 142
7 1690 2405
8 1298 1881
9 615 174
10 1648 3112
11 1415 2808

TABLE 6

Address of Parity Bit Accumulators (Rate ⅘)

5 896 1565
6 2493 184

TABLE 6-continued

Address of Parity Bit Accumulators (Rate ⅘)

7 212 3210
8 727 1339
9 3428 612
0 2663 1947
1 230 2695
2 2025 2794
3 3039 283
4 862 2889
5 376 2110
6 2034 2286
7 951 2068
8 3108 3542
9 307 1421
0 2272 1197
1 1800 3280
2 331 2308
3 465 2552
4 1038 2479
5 1383 343
6 94 236
7 2619 121
8 1497 2774
9 2116 1855
0 722 1584
1 2767 1881
2 2701 1610
3 3283 1732
4 168 1099
5 3074 243
6 3460 945
7 2049 1746
8 566 1427
9 3545 1168

TABLE 7

Address of Parity Bit Accumulators (Rate ⅚)

3 2409 499 1481 908 559 716 1270 333 2508 2264 1702 2805
4 2447 1926
5 414 1224
6 2114 842
7 212 573
0 2383 2112
1 2286 2348
2 545 819
3 1264 143
4 1701 2258
5 964 166
6 114 2413
7 2243 81
0 1245 1581
1 775 169
2 1696 1104
3 1914 2831
4 532 1450
5 91 974
6 497 2228
7 2326 1579
0 2482 256
1 1117 1261
2 1257 1658
3 1478 1225
4 2511 980
5 2320 2675
6 435 1278
7 228 503
0 1885 2369
1 57 483
2 838 1050
3 1231 1990
4 1738 68
5 2392 951

TABLE 7-continued

Address of Parity Bit Accumulators (Rate 5/6)

6 163 645
7 2644 1704

TABLE 8

Address of Parity Bit Accumulators (Rate 8/9)

0 1558 712 805
1 1450 873 1337
2 1741 1129 1184
3 294 806 1566
4 482 605 923
0 926 1578
1 777 1374
2 608 151
3 1195 210
4 1484 692
0 427 488
1 828 1124
2 874 1366
3 1500 835
4 1496 502
0 1006 1701
1 1155 97
2 657 1403
3 1453 624
4 429 1495
0 809 385
1 367 151
2 1323 202
3 960 318
4 1451 1039
0 1098 1722
1 1015 1428
2 1261 1564
3 544 1190
4 1472 1246
0 508 630
1 421 1704
2 284 898
3 392 577
4 1155 556
0 631 1000
1 732 1368
2 1328 329
3 1515 506
4 1104 1172

After all of the information bits are exhausted, the final parity bits are obtained as follows. First, the following operations are performed, starting with i=1

$p_i = p_i \oplus p_{i-1}, i=1,2,\ldots,n_{ldpc}-k_{ldpc}-1.$

Final content of $p_i$, i=0, 1, . . . , $n_{ldpc}-k_{ldpc}-1$ is equal to the parity bit $p_i$.

TABLE 9

| Code Rate | q |
|---|---|
| 2/3 | 60 |
| 5/6 | 30 |
| 1/2 | 90 |
| 3/4 | 45 |
| 4/5 | 36 |
| 3/5 | 72 |
| 8/9 | 20 |

The generator polynomial of the t error correcting BCH encoder 211 is obtained by multiplying the first t polynomials in the following list of Table 10:

TABLE 10

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$ |

BCH encoding of information bits $m=(m_{k_{bch}-1}, m_{k_{bch}-2}, \ldots, m_1, m_0)$ onto a codeword $c=(m_{k_{bch}-1}, m_{k_{bch}-2}, \ldots, m_1, m_0, d_{n_{bch}-k_{bch}-1}, d_{n_{bch}-k_{bch}-2}, \ldots, d_1, d_0)$ is achieved as follows. The message polynomial $m(x)=m_{k_{bch}-1}x^{k_{bch}-1} + m_{k_{bch}-2}x^{k_{bch}-2} + \ldots + m_1 x + m_0$ is multiplied by $x^{n_{bch}-k_{bch}}$. Next, $x^{n_{bch}-k_{bch}}m(x)$ divided by $g(x)$. With $d(x)=d_{n_{bch}-k_{bch}-1}x^{n_{bch}-k_{bch}-1} + \ldots + d_1 x + d_0$ as the remainder, the codeword polynomial is set as follows: $c(x) = x^{n_{bch}-k_{bch}}m(x) + d(x)$.

Figure 7:
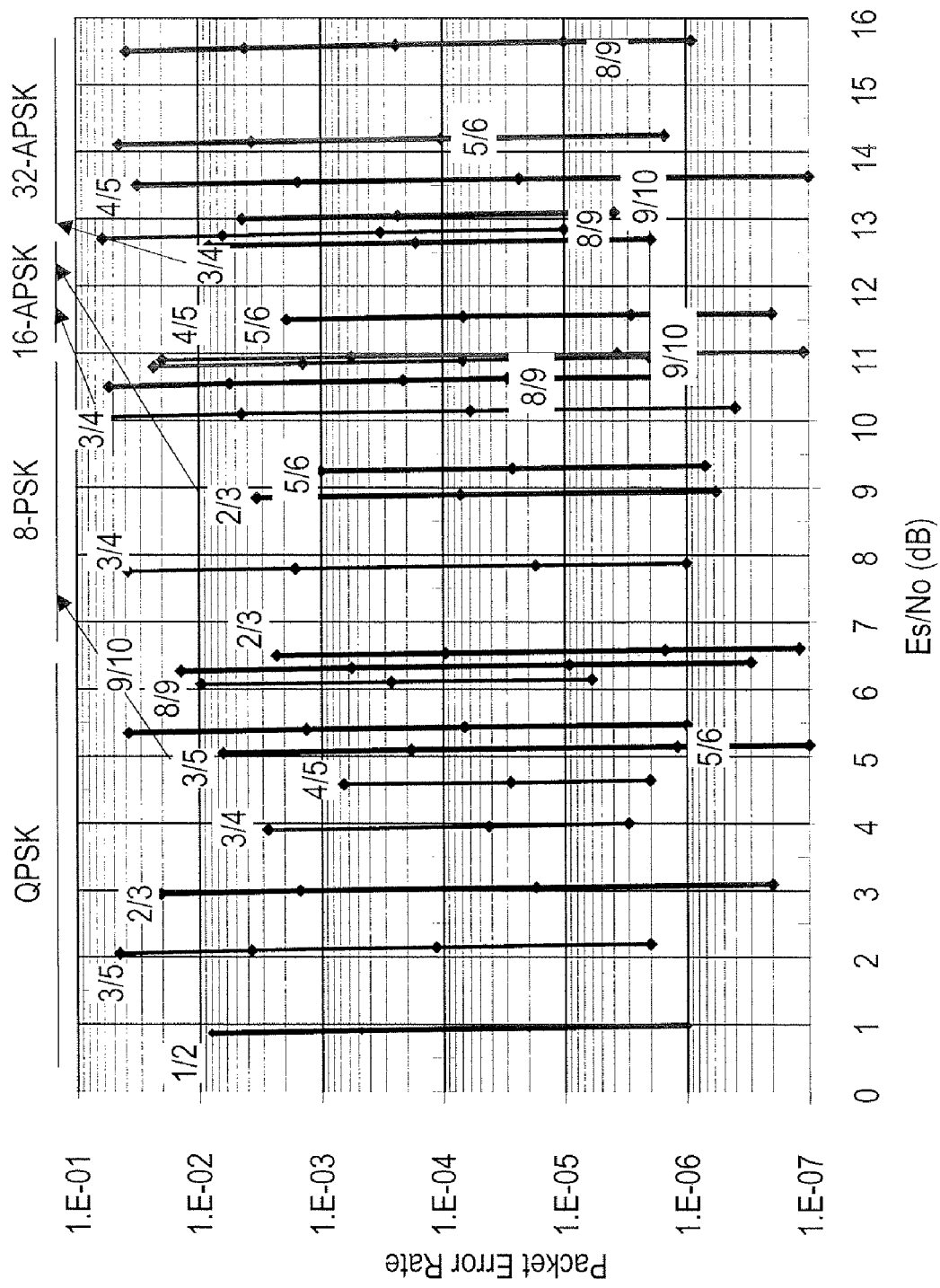
FIG. 7 is a graph of performance of the LDPC codes at the various code rates and modulation schemes supported by the transmitter of FIG. 2B.

As seen in FIG. 2B, the LDPC encoder 203 outputs to a bit interleaver 213. By way of example, 8-PSK, 16-APSK, and 32-APSK modulation formats are utilized. Data is serially written into the interleaver column-wise (from the top to the bottom), and serially read out row-wise (from the left to the right). However, in the case of code rate 3/5 with 8-PSK, it has been determined that reading the data out from the right to the left, instead of left to right, yields better performance (as illustrated in FIG. 7).

The configuration of the block interleaver for each modulation format is specified in Table 11.

TABLE 11

| | Bit Interleaver Structure | | |
|---|---|---|---|
| Modulation | Rows (for $n_{ldpc}$ = 64800) | Rows (for $n_{ldpc}$ = 16200) | Columns |
| 8-PSK | 21600 | 5400 | 3 |
| 16-APSK | 16200 | 4050 | 4 |
| 32-APSK | 12960 | 3240 | 5 |

Figure 2D:
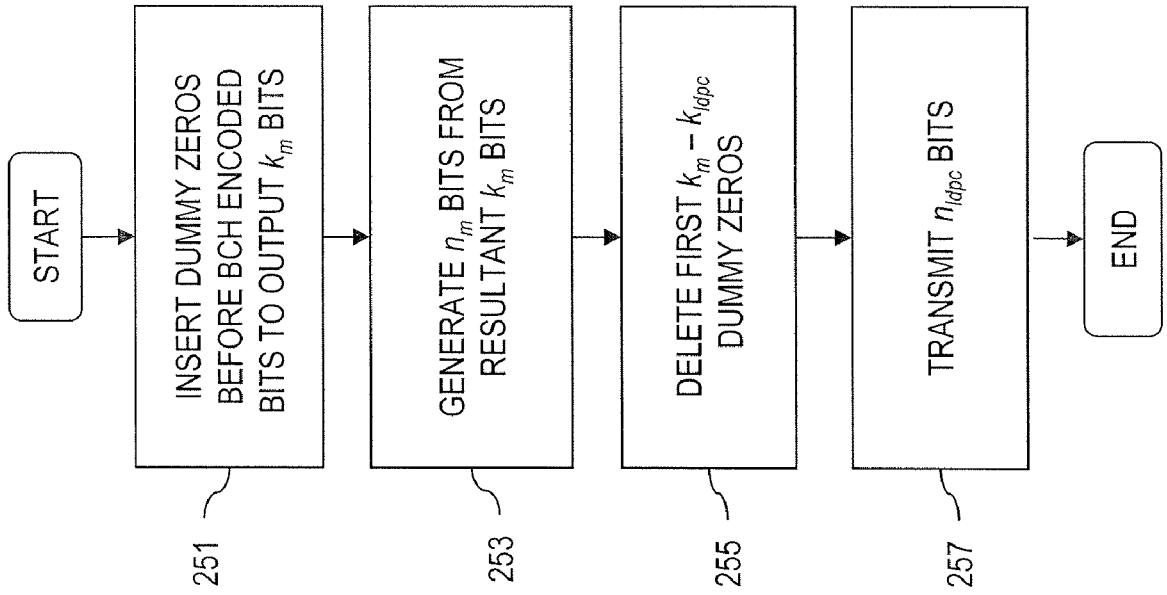

FIGS. 2C and 2D are flowcharts of the encoding process of the LDPC encoder of FIG. 2B for generating short frame length LDPC codes, according to an embodiment of the present invention. In step 211, information bits are received and processed to the chain of encoders 209, 211, and 203. Consequently, the LDPC encoder 203 generates LDPC codes with outer BCH codes based on the received information bits, as in step 223. The codes also contain the CRC code. In step 225, the coded bits are altered by the bit interleaver 213, as described above. Next, the LDPC codes are represented by signals that are modulated, per step 227, for transmission over the channel 103, which in an exemplary embodiment, is a satellite link to one or more satellite terminals (step 229).

As discussed, $k_{ldpc}$ bits are systematically encoded to generate $n_{ldpc}$ bits. According to one embodiment of the present invention, $n_{ldpc}$ is 16200 bits, which is a short block length. Given the relatively short length of such codes, LDPC codes having approximate lengths of 16200 bits or less are deemed "short" block length codes.

In accordance with an embodiment of the present invention, short blocks codes are generated by shortening versions of slightly longer ($k_m$, $n_m$) "mother" codes of block size $n_m>16200$. As shown in FIG. 2D, $k_{ldpc}$ of the BCH encoded bits are preceded by $k_m-k_{ldpc}$ dummy zeros (per step 251). The resulting $k_m$ bits are systematically encoded to generate $n_m$ bits, as in step 253. The first $k_m-k_{ldpc}$ dummy zeros are then deleted, as in step 255, and the resulting $n_{ldpc}$=16200 bits will be transmitted (step 257). It is noted that $k_m-k_{ldpc}=n_m-n_{ldpc}$.

The parameters of short frame length codes are provided in Table 12 as follows.

TABLE 12

| Mother Code Rate $k_m/n_m$ | $k_{ldpc}$ | $k_m$ | $n_m$ | $k_{bch}$ | BCH Correction (bits) | Effective Rate $k_{bch}/16200$ |
|---|---|---|---|---|---|---|
| 1/2 | 7200 | 9000 | 18000 | 7032 | 12 | 0.434 |
| 3/5 | 9720 | 9720 | 16200 | 9552 | 12 | 0.589 |
| 2/3 | 10800 | 10800 | 16200 | 10632 | 12 | 0.656 |
| 3/4 | 11880 | 12960 | 17280 | 11712 | 12 | 0.722 |
| 4/5 | 12600 | 14400 | 18000 | 12432 | 12 | 0.767 |
| 5/6 | 13320 | 14400 | 17280 | 13152 | 12 | 0.811 |
| 8/9 | 14400 | 14400 | 16200 | 14232 | 12 | 0.878 |

Figure 8:
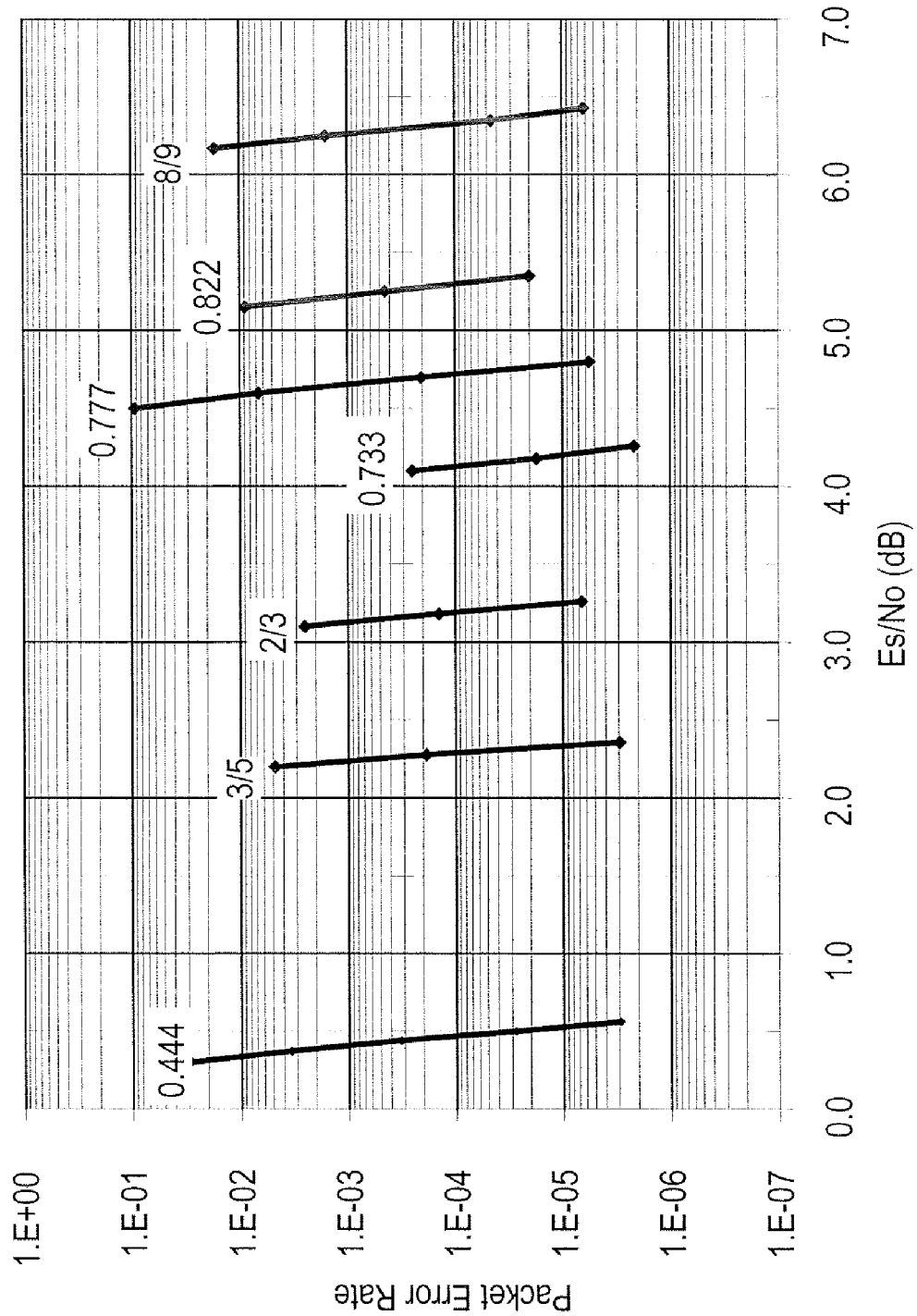
FIG. 8 is a graph of performance of the short LDPC codes at the various code rates supported by the transmitter of FIG. 2B.

Simulations of the performance of these codes were conducted, as shown in FIG. 8.

Tables 13-15 provide other exemplary code rates, 1/3, 1/5 and 2/5 for $n_{ldpc}$ of 16200 bits:

TABLE 13

Address of Parity Bit Accumulators (Rate 1/3)

416 8909 4156 3216 3112 2560 2912 6405 8593 4969 6723 6912
8978 3011 4339 9312 6396 2957 7288 5485 6031 10218 2226 3575
3383 10059 1114 10008 10147 9384 4290 434 5139 3536 1965 2291
2797 3693 7615 7077 743 1941 8716 6215 3840 5140 4582 5420
6110 8551 1515 7404 4879 4946 5383 1831 3441 9569 10472 4306
1505 5682 7778
7172 6830 6623
7281 3941 3505
10270 8669 914
3622 7563 9388
9930 5058 4554
4844 9609 2707
6883 3237 1714
4768 3878 10017
10127 3334 8267

TABLE 14

Address of Parity Bit Accumulators (Shortened from Rate 1/5)

6295 9626 304 7695 4839 4936 1660 144 11203 5567 6347 12557
10691 4988 3859 3734 3071 3494 7687 10313 5964 8069 8296 11090
10774 3613 5208 11177 7676 3549 8746 6583 7239 12265 2674 4292
11869 3708 5981 8718 4908 10650 6805 3334 2627 10461 9285 11120
7844 3079 10773
3385 10854 5747
1360 12010 12202
6189 4241 2343
9840 12726 4977

TABLE 15

Address of Parity Bit Accumulators (Rate 2/5)

5650 4143 8750 583 6720 8071 635 1767 1344 6922 738 6658
5696 1685 3207 415 7019 5023 5608 2605 857 6915 1770 8016
3992 771 2190 7258 8970 7792 1802 1866 6137 8841 886 1931
4108 3781 7577 6810 9322 8226 5396 5867 4428 8827 7766 2254
4247 888 4367 8821 9660 324 5864 4774 227 7889 6405 8963
9693 500 2520 2227 1811 9330 1928 5140 4030 4824 806 3134

TABLE 15-continued

Address of Parity Bit Accumulators (Rate 2/5)

1652 8171 1435
3366 6543 3745
9286 8509 4645
7397 5790 8972
6597 4422 1799
9276 4041 3847
8683 7378 4946
5348 1993 9186
6724 9015 5646
4502 4439 8474
5107 7342 9442
1387 8910 2660

The above approach to designing LDPC codes, as provided in Tables 2-8 and 13-15, advantageously permits storage and retrieval of relevant information regarding partitioned groups of bit nodes and check nodes to be always placed in contiguously memory locations within memory (e.g., Random Access Memory (RAM)). Further, this enables use of a single RAM bank, thereby minimizing size of the integrated circuit. As mentioned, the above LDPC codes, in an exemplary embodiment, can be used to variety of digital video applications, such as MPEG (Motion Pictures Expert Group) packet transmission.

Figure 3:
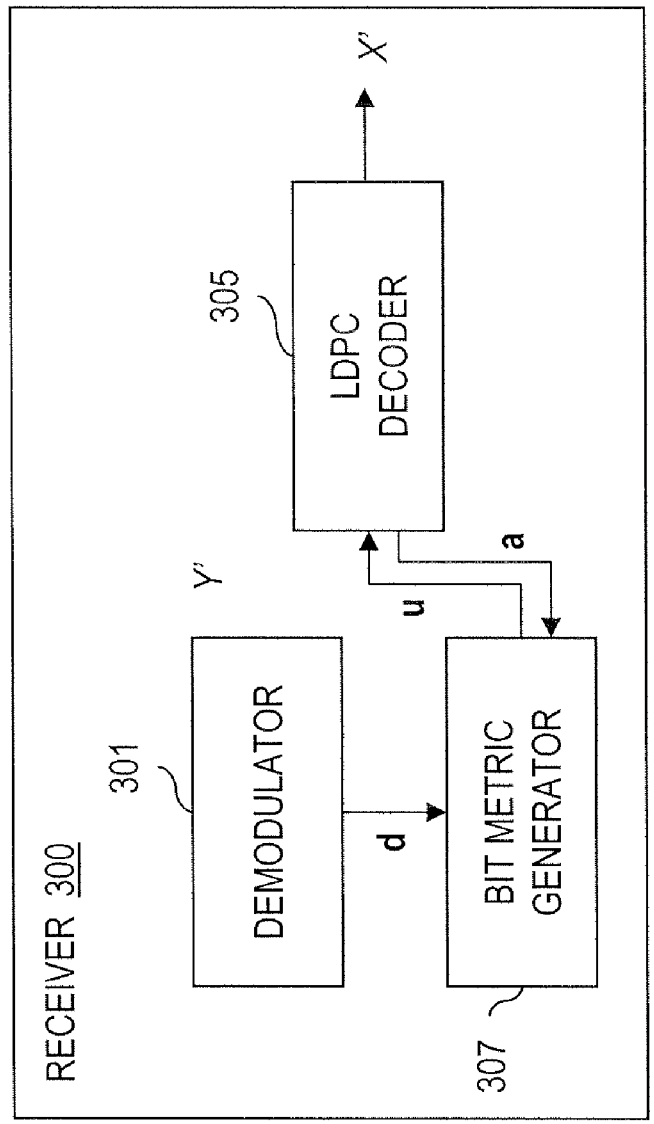
FIG. 3 is a diagram of an exemplary receiver in the system of FIG. 1.
Figure 3:
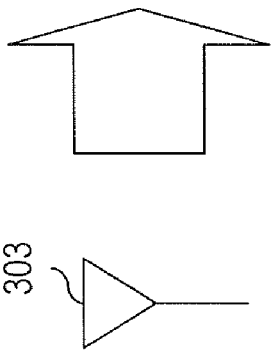

FIG. 3 is a diagram of an exemplary receiver in the system of FIG. 1. At the receiving side, a receiver 300 includes a demodulator 301 that performs demodulation of received signals from transmitter 200. These signals are received at a receive antenna 303 for demodulation. After demodulation, the received signals are forwarded to a decoder 305, which attempts to reconstruct the original source messages by generating messages, X', in conjunction with a bit metric generator 307. The bit metric generator 307 may exchange information with the decoder 305 back and forth (iteratively) during the decoding process. These decoding approaches are more fully described in co-pending application, entitled "Method and System for Routing in Low Density Parity Check (LDPC) Decoders," filed Jul. 3, 2003 (Ser. No. 10/613,824; which is incorporated herein in its entirety. To appreciate the advantages offered by the present invention, it is instructive to examine how LDPC codes are generated, as discussed in FIG. 4.

Figures 4, 5, 6:
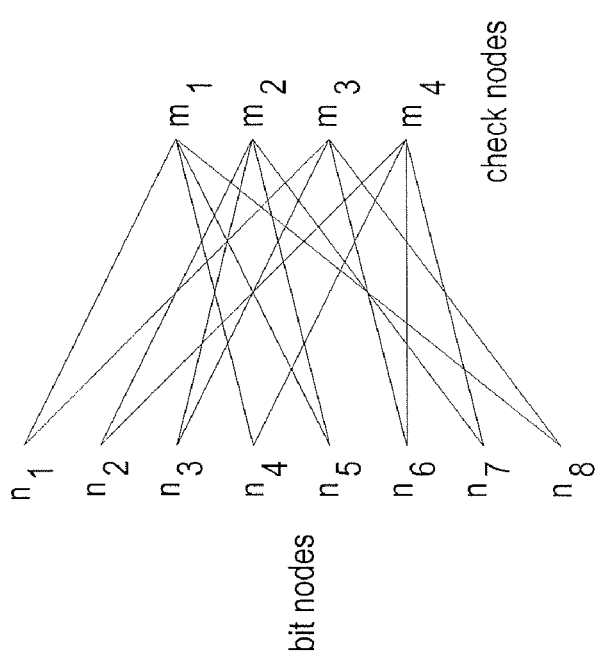
FIG. 4 is a diagram of a sparse parity check matrix, in accordance with an embodiment of the present invention.
FIG. 5 is a diagram of a bipartite graph of an LDPC code of the matrix of FIG. 4.
FIG. 6 is a diagram of a sub-matrix of a sparse parity check matrix, wherein the sub-matrix contains parity check values restricted to the lower triangular region, according to an embodiment of the present invention.

FIG. 4 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate 1/2 is shown in FIG. 4. The same code can be equivalently represented by the bipartite graph, per FIG. 5.

FIG. 5 is a diagram of a bipartite graph of an LDPC code of the matrix of FIG. 4. Parity check equations imply that for each check node, the sum (over GF (Galois Field)(2)) of all adjacent bit nodes is equal to zero. As seen in the figure, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning the receiver 303, the LDPC decoder 305 is considered a message passing decoder, whereby the decoder 305 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure is added.

From bit nodes to check nodes, each bit node relays to an adjacent check node an estimate about its own value based on the feedback coming from its other adjacent check nodes. In the above example n, has only two adjacent check nodes $m_1$ and $M_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 6 is a diagram of a sub-matrix of a sparse parity check matrix, wherein the sub-matrix contains parity check values restricted to the lower triangular region, according to an embodiment of the present invention. As described previously, the encoder 203 (of FIGS. 2A and 2B) can employ a simple encoding technique by restricting the values of the lower triangular area of the parity check matrix. According to an embodiment of the present invention, the restriction imposed on the parity check matrix is of the form:

$$H_{(n-k) \times n} = [A_{(n-k) \times k} B_{(n-k) \times (n-k)}],$$

where B is lower triangular.

Any information block $i=(i_0, i_1, \ldots, i_{k-1})$ is encoded to a codeword $C=(i_0, i_1, \ldots, i_{k-1}, p_0, p_1, \ldots p_{n-k-1})$ using $Hc^T=0$, and recursively solving for parity bits; for example, $$a_{00}i_0 + a_{01}i_1 + \ldots + a_{0,k-1}i_{k-1} + p_0 = 0 \rightarrow \text{Solve } p_0$$

$$a_{10}i_0 + a_{11}i_1 + \ldots + a_{1,k-1}i_{k-1} + b_{10}p_0 + p_1 = 0 \rightarrow \text{Solve } p_1$$

and similarly for $p_2, p_3, \ldots, p_{n-k-1}$.

FIG. 7 is a graph of performance of the LDPC codes at the various code rates and modulation schemes supported by the transmitter of FIG. 2B. As seen, the 3/5 rate, 8-PSK scenario rivals the performance of the LDPC codes employing QPSK.

FIG. 8 shows the simulation results for short block size LDPC codes, in accordance with an embodiment of the present invention. Table 16 provides the estimated performance at Packet Error Rate (PER) of $10^{-7}$ for the short codes ($n_{ldpc}=16200$).

TABLE 16

| Mode | Estimated Es/No (dB) |
|---|---|
| QPSK 0.444 | 0.65 |
| QPSK 3/5 | 2.45 |
| QPSK 2/3 | 3.35 |
| QPSK 0.733 | 4.35 |
| QPSK 0.777 | 4.90 |
| QPSK 0.822 | 5.40 |
| QPSK 8/9 | 6.50 |

Figure 9:
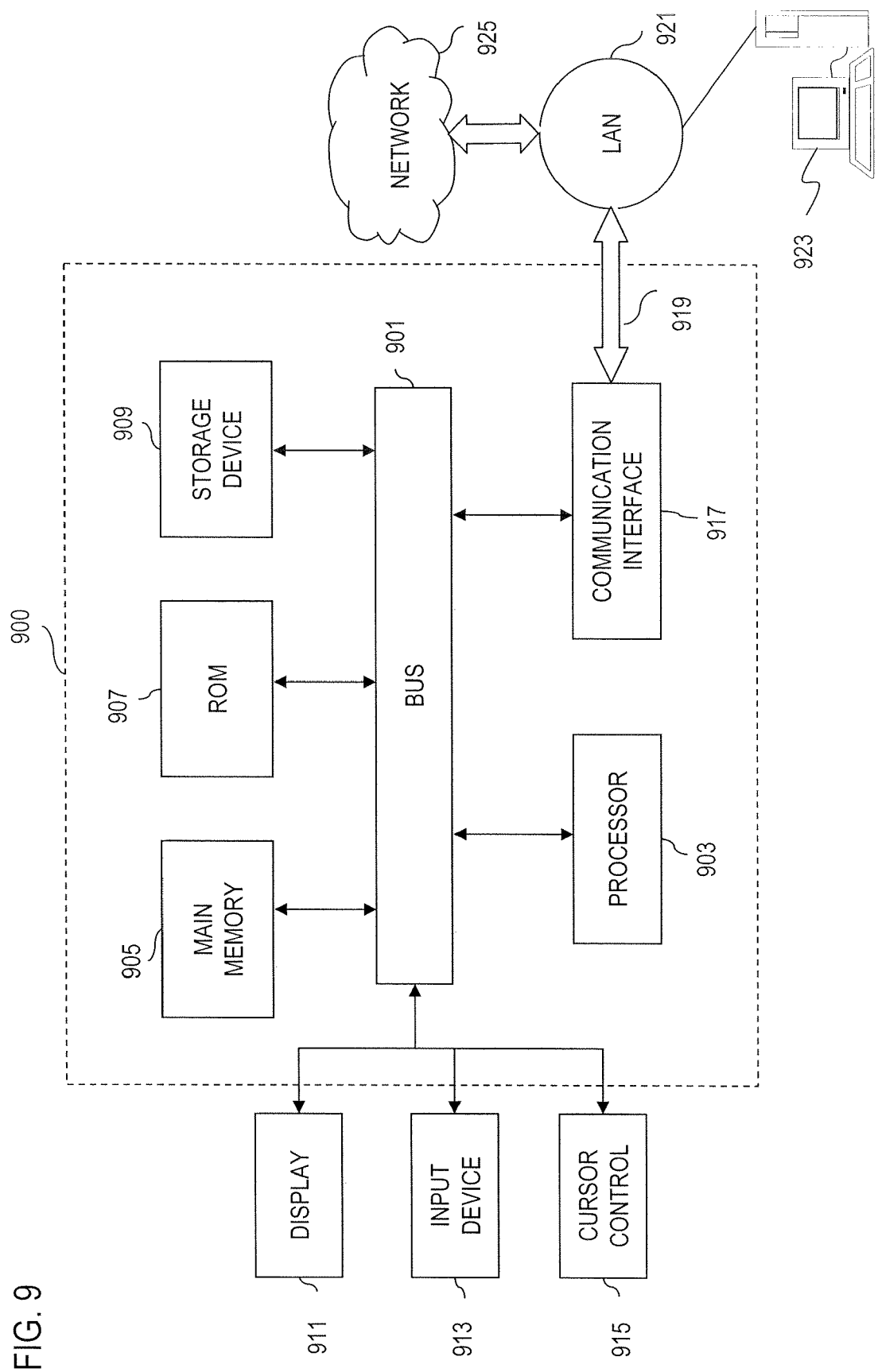
FIG. 9 is a diagram of a computer system that can perform the LDPC encoding process, in accordance with embodiments of the present invention.

FIG. 9 illustrates a computer system upon which an embodiment according to the present invention can be implemented. The computer system 900 includes a bus 901 or other communication mechanism for communicating information, and a processor 903 coupled to the bus 901 for processing information. The computer system 900 also includes main memory 905, such as a random access memory (RAM) or other dynamic storage device, coupled to the bus 901 for storing information and instructions to be executed by the processor 903. Main memory 905 can also be used for storing temporary variables or other intermediate information during execution of instructions to be executed by the processor 903. The computer system 900 further includes a read only memory (ROM) 907 or other static storage device coupled to the bus 901 for storing static information and instructions for the processor 903. A storage device 909, such as a magnetic disk or optical disk, is additionally coupled to the bus 901 for storing information and instructions.

The computer system 900 may be coupled via the bus 901 to a display 911, such as a cathode ray tube (CRT), liquid crystal display, active matrix display, or plasma display, for displaying information to a computer user. An input device 913, such as a keyboard including alphanumeric and other keys, is coupled to the bus 901 for communicating information and command selections to the processor 903. Another type of user input device is cursor control 915, such as a mouse, a trackball, or cursor direction keys for communicating direction information and command selections to the processor 903 and for controlling cursor movement on the display 911.

According to one embodiment of the invention, generation of LDPC codes is provided by the computer system 900 in response to the processor 903 executing an arrangement of instructions contained in main memory 905. Such instructions can be read into main memory 905 from another computer-readable medium, such as the storage device 909. Execution of the arrangement of instructions contained in main memory 905 causes the processor 903 to perform the process steps described herein. One or more processors in a multi-processing arrangement may also be employed to execute the instructions contained in main memory 905. In alternative embodiments, hard-wired circuitry may be used in place of or in combination with software instructions to implement the embodiment of the present invention. Thus, embodiments of the present invention are not limited to any specific combination of hardware circuitry and software.

The computer system 900 also includes a communication interface 917 coupled to bus 901. The communication interface 917 provides a two-way data communication coupling to a network link 919 connected to a local network 921. For example, the communication interface 917 may be a digital subscriber line (DSL) card or modem, an integrated services digital network (ISDN) card, a cable modem, or a telephone modem to provide a data communication connection to a corresponding type of telephone line. As another example, communication interface 917 may be a local area network (LAN) card (e.g. for Ethernet™ or an Asynchronous Transfer Model (ATM) network) to provide a data communication connection to a compatible LAN. Wireless links can also be implemented. In any such implementation, communication interface 917 sends and receives electrical, electromagnetic, or optical signals that carry digital data streams representing various types of information. Further, the communication interface 917 can include peripheral interface devices, such as a Universal Serial Bus (USB) interface, a PCMCIA (Personal Computer Memory Card International Association) interface, etc.

The network link 919 typically provides data communication through one or more networks to other data devices. For example, the network link 919 may provide a connection through local network 921 to a host computer 923, which has connectivity to a network 925 (e.g. a wide area network (WAN) or the global packet data communication network now commonly referred to as the "Internet") or to data equipment operated by service provider. The local network 921 and network 925 both use electrical, electromagnetic, or optical signals to convey information and instructions. The signals through the various networks and the signals on network link 919 and through communication interface 917, which communicate digital data with computer system 900, are exemplary forms of carrier waves bearing the information and instructions.

The computer system 900 can send messages and receive data, including program code, through the network(s), network link 919, and communication interface 917. In the Internet example, a server (not shown) might transmit requested code belonging to an application program for implementing an embodiment of the present invention through the network 925, local network 921 and communication interface 917. The processor 903 may execute the transmitted code while being received and/or store the code in storage device 99, or other non-volatile storage for later execution. In this manner, computer system 900 may obtain application code in the form of a carrier wave.

The term "computer-readable medium" as used herein refers to any medium that participates in providing instructions to the processor 903 for execution. Such a medium may take many forms, including but not limited to non-volatile media, volatile media, and transmission media. Non-volatile media include, for example, optical or magnetic disks, such as storage device 909. Volatile media include dynamic memory, such as main memory 905. Transmission media include coaxial cables, copper wire and fiber optics, including the wires that comprise bus 901. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Accordingly, the various embodiments of the present invention provide an LDPC encoder generates a LDPC code having an outer Bose Chaudhuri Hocquenghem (BCH) code according to one of Tables 2-8 for transmission as a LDPC coded signal. Each of the Tables 2-8 specifies the address of parity bit accumulators. Short LDPC codes are output by utilizing LDPC mother codes that are based on Tables 2-8. $k_{ldpc}$ of the BCH encoded bits are preceded by $k_m - k_{ldpc}$ dummy zeros. The resulting $k_m$ bits are systematically encoded to generate $n_m$ bits. The first $k_m - k_{ldpc}$ dummy zeros are then deleted to yield the shortened code. For an LDPC code with code rate of ⅗ utilizing 8-PSK (Phase Shift Keying) modulation, an interleaver provides for interleaving bits of the output LDPC code by serially writing data associated with the LDPC code column-wise into a table and reading the data row-wise from right to left. The above approach advantageously yields reduced complexity without sacrificing performance.

While the present invention has been described in connection with a number of embodiments and implementations, the present invention is not so limited but covers various obvious modifications and equivalent arrangements, which fall within the purview of the appended claims.

What is claimed is:

1. A method comprising:
   encoding information bits to output short Low Density Parity Check (LDPC) codes of 16200 bits in length according to a parity check matrix corresponding to one of a plurality of code rates associated with respective tables each specifying address of parity bit accumulators,

| Address of Parity Bit Accumulators (Rate ½) |
|---|
| 20 712 2386 6354 4061 1062 5045 5158 |
| 21 2543 5748 4822 2348 3089 6328 5876 |
| 22 926 5701 269 3693 2438 3190 3507 |
| 23 2802 4520 3577 5324 1091 4667 4449 |
| 24 5140 2003 1263 4742 6497 1185 6202 |
| 0 4046 6934 |
| 1 2855 66 |
| 2 6694 212 |
| 3 3439 1158 |
| 4 3850 4422 |
| 5 5924 290 |
| 6 1467 4049 |
| 7 7820 2242 |
| 8 4606 3080 |
| 9 4633 7877 |
| 10 3884 6868 |
| 11 8935 4996 |
| 12 3028 764 |
| 13 5988 1057 |
| 14 7411 3450 |
| 13 5988 1057 |
| 14 7411 3450 |

| Address of Parity Bit Accumulators (Rate ⅗) |
|---|
| 2765 5713 6426 3596 1374 4811 2182 544 3394 2840 4310 771 |
| 4951 211 2208 723 1246 2928 398 5739 265 5601 5993 2615 |
| 210 4730 5777 3096 4282 6238 4939 1119 6463 5298 6320 4016 |
| 4167 2063 4757 3157 5664 3956 6045 563 4284 2441 3412 6334 |
| 4201 2428 4474 59 1721 736 2997 428 3807 1513 4732 6195 |
| 2670 3081 5139 3736 1999 5889 4362 3806 4534 5409 6384 5809 |
| 5516 1622 2906 3285 1257 5797 3816 817 875 2311 3543 1205 |
| 4244 2184 5415 1705 5642 4886 2333 287 1848 1121 3595 6022 |
| 2142 2830 4069 5654 1295 2951 3919 1356 884 1786 396 4738 |

-continued

| Address of Parity Bit Accumulators (Rate ⅗) |
|---|
| 0 2161 2653 |
| 1 1380 1461 |
| 2 2502 3707 |
| 3 3971 1057 |
| 4 5985 6062 |
| 5 1733 6028 |
| 6 3786 1936 |
| 7 4292 956 |
| 8 5692 3417 |
| 9 266 4878 |
| 10 4913 3247 |
| 11 4763 3937 |
| 12 3590 2903 |
| 13 2566 4215 |
| 14 5208 4707 |
| 15 3940 3388 |
| 16 5109 4556 |
| 17 4908 4177 |

| Address of Parity Bit Accumulators (Rate ⅔) |
|---|
| 0 2084 1613 1548 1286 1460 3196 4297 2481 3369 3451 4620 2622 |
| 1 122 1516 3448 2880 1407 1847 3799 3529 373 971 4358 3108 |
| 2 259 3399 929 2650 864 3996 3833 107 5287 164 3125 2350 |
| 3 342 3529 |
| 4 4198 2147 |
| 5 1880 4836 |
| 6 3864 4910 |
| 7 243 1542 |
| 8 3011 1436 |
| 9 2167 2512 |
| 10 4606 1003 |
| 11 2835 705 |
| 12 3426 2365 |
| 13 3848 2474 |
| 14 1360 1743 |
| 0 163 2536 |
| 1 2583 1180 |
| 2 1542 509 |
| 3 4418 1005 |
| 4 5212 5117 |
| 5 2155 2922 |
| 6 347 2696 |
| 7 226 4296 |
| 8 1560 487 |
| 9 3926 1640 |
| 10 149 2928 |
| 11 2364 563 |
| 12 635 688 |
| 13 231 1684 |
| 14 1129 3894 |

| Address of Parity Bit Accumulators (Rate ¾) |
|---|
| 3 3198 478 4207 1481 1009 2616 1924 3437 554 683 1801 |
| 4 2681 2135 |
| 5 3107 4027 |
| 6 2637 3373 |
| 7 3830 3449 |
| 8 4129 2060 |
| 9 4184 2742 |
| 10 3946 1070 |
| 11 2239 984 |
| 0 1458 3031 |
| 1 3003 1328 |
| 2 1137 1716 |
| 3 132 3725 |
| 4 1817 638 |

-continued

| Address of Parity Bit Accumulators (Rate ¾) |
|---|
| 5 1774 3447 |
| 6 3632 1257 |
| 7 542 3694 |
| 8 1015 1945 |
| 9 1948 412 |
| 10 995 2238 |
| 11 4141 1907 |
| 0 2480 3079 |
| 1 3021 1088 |
| 2 713 1379 |
| 3 997 3903 |
| 4 2323 3361 |
| 5 1110 986 |
| 6 2532 142 |
| 7 1690 2405 |
| 8 1298 1881 |
| 9 615 174 |
| 10 1648 3112 |
| 11 1415 2808 |

| Address of Parity Bit Accumulators (Rate ⅘) |
|---|
| 5 896 1565 |
| 6 2493 184 |
| 7 212 3210 |
| 8 727 1339 |
| 9 3428 612 |
| 0 2663 1947 |
| 1 230 2695 |
| 2 2025 2794 |
| 3 3039 283 |
| 4 862 2889 |
| 5 376 2110 |
| 6 2034 2286 |
| 7 951 2068 |
| 8 3108 3542 |
| 9 307 1421 |
| 0 2272 1197 |
| 1 1800 3280 |
| 2 331 2308 |
| 3 465 2552 |
| 4 1038 2479 |
| 5 1383 343 |
| 6 94 236 |
| 7 2619 121 |
| 8 1497 2774 |
| 9 2116 1855 |
| 0 722 1584 |
| 1 2767 1881 |
| 2 2701 1610 |
| 3 3283 1732 |
| 4 168 1099 |
| 5 3074 243 |
| 6 3460 945 |
| 7 2049 1746 |
| 8 566 1427 |
| 9 3545 1168 |

| Address of Parity Bit Accumulators (Rate ⅚) |
|---|
| 3 2409 499 1481 908 559 716 1270 333 2508 2264 1702 2805 |
| 4 2447 1926 |
| 5 414 1224 |
| 6 2114 842 |
| 7 212 573 |
| 0 2383 2112 |
| 1 2286 2348 |
| 2 545 819 |
| 3 1264 143 |

| Address of Parity Bit Accumulators (Rate 5/6) |
|---|
| 4 1701 2258 |
| 5 964 166 |
| 6 114 2413 |
| 7 2243 81 |
| 0 1245 1581 |
| 1 775 169 |
| 2 1696 1104 |
| 3 1914 2831 |
| 4 532 1450 |
| 5 91 974 |
| 6 497 2228 |
| 7 2326 1579 |
| 0 2482 256 |
| 1 1117 1261 |
| 2 1257 1658 |
| 3 1478 1225 |
| 4 2511 980 |
| 5 2320 2675 |
| 6 435 1278 |
| 7 228 503 |
| 0 1885 2369 |
| 1 57 483 |
| 2 838 1050 |
| 3 1231 1990 |
| 4 1738 68 |
| 5 2392 951 |
| 6 163 645 |
| 7 2644 1704 |

| Address of Parity Bit Accumulators (Rate 8/9) |
|---|
| 0 1558 712 805 |
| 1 1450 873 1337 |
| 2 1741 1129 1184 |
| 3 294 806 1566 |
| 4 482 605 923 |
| 0 926 1578 |
| 1 777 1374 |
| 2 608 151 |
| 3 1195 210 |
| 4 1484 692 |
| 0 427 488 |
| 1 828 1124 |
| 2 874 1366 |
| 3 1500 835 |
| 4 1496 502 |
| 0 1006 1701 |
| 1 1155 97 |
| 2 657 1403 |
| 3 1453 624 |
| 4 429 1495 |
| 0 809 385 |
| 1 367 151 |
| 2 1323 202 |
| 3 960 318 |
| 4 1451 1039 |
| 0 1098 1722 |
| 1 1015 1428 |
| 2 1261 1564 |
| 3 544 1190 |
| 4 1472 1246 |
| 0 508 630 |
| 1 421 1704 |
| 2 284 898 |
| 3 392 577 |
| 4 1155 556 |
| 0 631 1000 |
| 1 732 1368 |
| 2 1328 329 |
| 3 1515 506 |
| 4 1104 1172 |

| Address of Parity Bit Accumulators (Rate 1/3) |
|---|
| 416 8909 4156 3216 3112 2560 2912 6405 8593 4969 6723 6912 |
| 8978 3011 4339 9312 6396 2957 7288 5485 6031 10218 2226 3575 |
| 3383 10059 1114 10008 10147 9384 4290 434 5139 3536 1965 2291 |
| 2797 3693 7615 7077 743 1941 8716 6215 3840 5140 4582 5420 |
| 6110 8551 1515 7404 4879 4946 5383 1831 3441 9569 10472 4306 |
| 1505 5682 7778 |
| 7172 6830 6623 |
| 7281 3941 3505 |
| 10270 8669 914 |
| 3622 7563 9388 |
| 9930 5058 4554 |
| 4844 9609 2707 |
| 6883 3237 1714 |
| 4768 3878 10017 |
| 10127 3334 8267 |

| Address of Parity Bit Accumulators (Rate 1/4, Shortened from Rate 1/3) |
|---|
| 6295 9626 304 7695 4839 4936 1660 144 11203 5567 6347 12557 |
| 10691 4988 3859 3734 3071 3494 7687 10313 5964 8069 8296 11090 |
| 10774 3613 5208 11177 7676 3549 8746 6583 7239 12265 2674 4292 |
| 11869 3708 5981 8718 4908 10650 6805 3334 2627 10461 9285 11120 |
| 7844 3079 10773 |
| 3385 10854 5747 |
| 1360 12010 12202 |
| 6189 4241 2343 |
| 9840 12726 4977 |

| Address of Parity Bit Accumulators (Rate 2/5) |
|---|
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660. |

2. A method according to claim 1, further comprising:
applying an outer code to the short LDPC codes using Bose Chaudhuri Hocquenghem (BCH) codes to generate a coded signal, wherein the coded signal includes cyclic redundancy check (CRC) codes.

3. A method according to claim 2, wherein the BCH codes are generated according to the following polynomial:

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |

-continued

| | |
|---|---|
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$. |

4. A method according to claim 1, wherein the coded signal is modulated according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

5. A method according to claim 1, further comprising:

feeding the coded signal to a block interleaver having a structure according to the following table:

| | Bit Interleaver Structure | |
|---|---|---|
| Modulation | Rows (for $n_{ldpc}$ = 16200) | Columns |
| 8-PSK | 5400 | 3 |
| 16-APSK | 4050 | 4 |
| 32-APSK | 3240 | 5. |

6. A receiver configured to receive a signal encoded in accordance with claim 1.

7. An apparatus comprising:

circuitry configured to encode information bits to output short Low Density Parity Check (LDPC) codes of 16200 bits in length according to a parity check matrix corresponding to one of a plurality of code rates associated with respective tables each specifying address of parity bit accumulators, Address of Parity Bit Accumulators (Rate ½)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764
13 5988 1057
14 7411 3450

Address of Parity Bit Accumulators (Rate ⅗)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

Address of Parity Bit Accumulators (Rate ⅔)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

Address of Parity Bit Accumulators (Rate ¾)

3 3198 478 4207 1481 1009 2616 1924 3437 554 683 1801
4 2681 2135
5 3107 4027
6 2637 3373
7 3830 3449

| Address of Parity Bit Accumulators (Rate 3/4) |
| --- |
| 8 4129 2060 |
| 9 4184 2742 |
| 10 3946 1070 |
| 11 2239 984 |
| 0 1458 3031 |
| 1 3003 1328 |
| 2 1137 1716 |
| 3 132 3725 |
| 4 1817 638 |
| 5 1774 3447 |
| 6 3632 1257 |
| 7 542 3694 |
| 8 1015 1945 |
| 9 1948 412 |
| 10 995 2238 |
| 11 4141 1907 |
| 0 2480 3079 |
| 1 3021 1088 |
| 2 713 1379 |
| 3 997 3903 |
| 4 2323 3361 |
| 5 1110 986 |
| 6 2532 142 |
| 7 1690 2405 |
| 8 1298 1881 |
| 9 615 174 |
| 10 1648 3112 |
| 11 1415 2808 |

| Address of Parity Bit Accumulators (Rate 4/5) |
| --- |
| 5 896 1565 |
| 6 2493 184 |
| 7 212 3210 |
| 8 727 1339 |
| 9 3428 612 |
| 0 2663 1947 |
| 1 230 2695 |
| 2 2025 2794 |
| 3 3039 283 |
| 4 862 2889 |
| 5 376 2110 |
| 6 2034 2286 |
| 7 951 2068 |
| 8 3108 3542 |
| 9 307 1421 |
| 0 2272 1197 |
| 1 1800 3280 |
| 2 331 2308 |
| 3 465 2552 |
| 4 1038 2479 |
| 5 1383 343 |
| 6 94 236 |
| 7 2619 121 |
| 8 1497 2774 |
| 9 2116 1855 |
| 0 722 1584 |
| 1 2767 1881 |
| 2 2701 1610 |
| 3 3283 1732 |
| 4 168 1099 |
| 5 3074 243 |
| 6 3460 945 |
| 7 2049 1746 |
| 8 566 1427 |
| 9 3545 1168 |

| Address of Parity Bit Accumulators (Rate 5/6) |
| --- |
| 3 2409 499 1481 908 559 716 1270 333 2508 2264 1702 2805 |
| 4 2447 1926 |
| 5 414 1224 |
| 6 2114 842 |
| 7 212 573 |
| 0 2383 2112 |
| 1 2286 2348 |
| 2 545 819 |
| 3 1264 143 |
| 4 1701 2258 |
| 5 964 166 |
| 6 114 2413 |
| 7 2243 81 |
| 0 1245 1581 |
| 1 775 169 |
| 2 1696 1104 |
| 3 1914 2831 |
| 4 532 1450 |
| 5 91 974 |
| 6 497 2228 |
| 7 2326 1579 |
| 0 2482 256 |
| 1 1117 1261 |
| 2 1257 1658 |
| 3 1478 1225 |
| 4 2511 980 |
| 5 2320 2675 |
| 6 435 1278 |
| 7 228 503 |
| 0 1885 2369 |
| 1 57 483 |
| 2 838 1050 |
| 3 1231 1990 |
| 4 1738 68 |
| 5 2392 951 |
| 6 163 645 |
| 7 2644 1704 |

| Address of Parity Bit Accumulators (Rate 8/9) |
| --- |
| 0 1558 712 805 |
| 1 1450 873 1337 |
| 2 1741 1129 1184 |
| 3 294 806 1566 |
| 4 482 605 923 |
| 0 926 1578 |
| 1 777 1374 |
| 2 608 151 |
| 3 1195 210 |
| 4 1484 692 |
| 0 427 488 |
| 1 828 1124 |
| 2 874 1366 |
| 3 1500 835 |
| 4 1496 502 |
| 0 1006 1701 |
| 1 1155 97 |
| 2 657 1403 |
| 3 1453 624 |
| 4 429 1495 |
| 0 809 385 |
| 1 367 151 |
| 2 1323 202 |
| 3 960 318 |
| 4 1451 1039 |
| 0 1098 1722 |
| 1 1015 1428 |
| 2 1261 1564 |
| 3 544 1190 |
| 4 1472 1246 |
| 0 508 630 |
| 1 421 1704 |

-continued

| Address of Parity Bit Accumulators (Rate 8/9) |
|---|
| 2 284 898 |
| 3 392 577 |
| 4 1155 556 |
| 0 631 1000 |
| 1 732 1368 |
| 2 1328 329 |
| 3 1515 506 |
| 4 1104 1172 |

| Address of Parity Bit Accumulators (Rate 1/3) |
|---|
| 416 8909 4156 3216 3112 2560 2912 6405 8593 4969 6723 6912 |
| 8978 3011 4339 9312 6396 2957 7288 5485 6031 10218 2226 3575 |
| 3383 10059 1114 10008 10147 9384 4290 434 5139 3536 1965 2291 |
| 2797 3693 7615 7077 743 1941 8716 6215 3840 5140 4582 5420 |
| 6110 8551 1515 7404 4879 4946 5383 1831 3441 9569 10472 4306 |
| 1505 5682 7778 |
| 7172 6830 6623 |
| 7281 3941 3505 |
| 10270 8669 914 |
| 3622 7563 9388 |
| 9930 5058 4554 |
| 4844 9609 2707 |
| 6883 3237 1714 |
| 4768 3878 10017 |
| 10127 3334 8267 |

| Address of Parity Bit Accumulators (Rate 1/4, Shortened from Rate 1/3) |
|---|
| 6295 9626 304 7695 4839 4936 1660 144 11203 5567 6347 12557 |
| 10691 4988 3859 3734 3071 3494 7687 10313 5964 8069 8296 11090 |
| 10774 3613 5208 11177 7676 3549 8746 6583 7239 12265 2674 4292 |
| 11869 3708 5981 8718 4908 10650 6805 3334 2627 10461 9285 11120 |
| 7844 3079 10773 |
| 3385 10854 5747 |
| 1360 12010 12202 |
| 6189 4241 2343 |
| 9840 12726 4977 |

| Address of Parity Bit Accumulators (Rate 2/5) |
|---|
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660 |

8. An apparatus according to claim 7, further comprising: applying an outer code to the short LDPC codes using Bose Chaudhuri Hocquenghem (BCH) codes to generate a coded signal, wherein the coded signal includes cyclic redundancy check (CRC) codes.

9. An apparatus according to claim 8, wherein the BCH codes are generated according to the following polynomial:

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$. |

10. An apparatus according to claim 7, wherein the coded signal is modulated according to a signal constellation that includes one of 8-PSK (Phase Shift Keying), 16-QAM (Quadrature Amplitude Modulation), QPSK (Quadrature Phase Shift Keying), 16-APSK (Amplitude Phase Shift Keying) and 32-APSK.

11. An apparatus according to claim 7, wherein the circuitry is further configured to feed the coded signal to a block interleaver having a structure according to the following table:

| Bit Interleaver Structure | | |
|---|---|---|
| Modulation | Rows (for $n_{ldpc}$ = 16200) | Columns |
| 8-PSK | 5400 | 3 |
| 16-APSK | 4050 | 4 |
| 32-APSK | 3240 | 5. |

12. A method comprising:
receiving an Low Density Parity Check (LDPC) coded signal; and
decoding the signal by accessing edge values to satisfy parity check equations relating to LPDC codes of 16200 bits in length and corresponding to one of a plurality of code rates associated with respective tables each specifying address of parity bit accumulators,

| Address of Parity Bit Accumulators (Rate 1/2) |
|---|
| 20 712 2386 6354 4061 1062 5045 5158 |
| 21 2543 5748 4822 2348 3089 6328 5876 |
| 22 926 5701 269 3693 2438 3190 3507 |
| 23 2802 4520 3577 5324 1091 4667 4449 |
| 24 5140 2003 1263 4742 6497 1185 6202 |
| 0 4046 6934 |
| 1 2855 66 |
| 2 6694 212 |
| 3 3439 1158 |
| 4 3850 4422 |
| 5 5924 290 |
| 6 1467 4049 |
| 7 7820 2242 |
| 8 4606 3080 |
| 9 4633 7877 |
| 10 3884 6868 |
| 11 8935 4996 |
| 12 3028 764 |

| Address of Parity Bit Accumulators (Rate ½) |
|---|
| 13 5988 1057 |
| 14 7411 3450 |

| Address of Parity Bit Accumulators (Rate ⅗) |
|---|
| 2765 5713 6426 3596 1374 4811 2182 544 3394 2840 4310 771 |
| 4951 211 2208 723 1246 2928 398 5739 265 5601 5993 2615 |
| 210 4730 5777 3096 4282 6238 4939 1119 6463 5298 6320 4016 |
| 4167 2063 4757 3157 5664 3956 6045 563 4284 2441 3412 6334 |
| 4201 2428 4474 59 1721 736 2997 428 3807 1513 4732 6195 |
| 2670 3081 5139 3736 1999 5889 4362 3806 4534 5409 6384 5809 |
| 5516 1622 2906 3285 1257 5797 3816 817 875 2311 3543 1205 |
| 4244 2184 5415 1705 5642 4886 2333 287 1848 1121 3595 6022 |
| 2142 2830 4069 5654 1295 2951 3919 1356 884 1786 396 4738 |
| 0 2161 2653 |
| 1 1380 1461 |
| 2 2502 3707 |
| 3 3971 1057 |
| 4 5985 6062 |
| 5 1733 6028 |
| 6 3786 1936 |
| 7 4292 956 |
| 8 5692 3417 |
| 9 266 4878 |
| 10 4913 3247 |
| 11 4763 3937 |
| 12 3590 2903 |
| 13 2566 4215 |
| 14 5208 4707 |
| 15 3940 3388 |
| 16 5109 4556 |
| 17 4908 4177 |

| Address of Parity Bit Accumulators (Rate ⅔) |
|---|
| 0 2084 1613 1548 1286 1460 3196 4297 2481 3369 3451 4620 2622 |
| 1 122 1516 3448 2880 1407 1847 3799 3529 373 971 4358 3108 |
| 2 259 3399 929 2650 864 3996 3833 107 5287 164 3125 2350 |
| 3 342 3529 |
| 4 4198 2147 |
| 5 1880 4836 |
| 6 3864 4910 |
| 7 243 1542 |
| 8 3011 1436 |
| 9 2167 2512 |
| 10 4606 1003 |
| 11 2835 705 |
| 12 3426 2365 |
| 13 3848 2474 |
| 14 1360 1743 |
| 0 163 2536 |
| 1 2583 1180 |
| 2 1542 509 |
| 3 4418 1005 |
| 4 5212 5117 |
| 5 2155 2922 |
| 6 347 2696 |
| 7 226 4296 |
| 8 1560 487 |
| 9 3926 1640 |
| 10 149 2928 |
| 11 2364 563 |
| 12 635 688 |
| 13 231 1684 |
| 14 1129 3894 |

| Address of Parity Bit Accumulators (Rate ¾) |
|---|
| 3 3198 478 4207 1481 1009 2616 1924 3437 554 683 1801 |
| 4 2681 2135 |
| 5 3107 4027 |
| 6 2637 3373 |
| 7 3830 3449 |
| 8 4129 2060 |
| 9 4184 2742 |
| 10 3946 1070 |
| 11 2239 984 |
| 0 1458 3031 |
| 1 3003 1328 |
| 2 1137 1716 |
| 3 132 3725 |
| 4 1817 638 |
| 5 1774 3447 |
| 6 3632 1257 |
| 7 542 3694 |
| 8 1015 1945 |
| 9 1948 412 |
| 10 995 2238 |
| 11 4141 1907 |
| 0 2480 3079 |
| 1 3021 1088 |
| 2 713 1379 |
| 3 997 3903 |
| 4 2323 3361 |
| 5 1110 986 |
| 6 2532 142 |
| 7 1690 2405 |
| 8 1298 1881 |
| 9 615 174 |
| 10 1648 3112 |
| 11 1415 2808 |

| Address of Parity Bit Accumulators (Rate ⅘) |
|---|
| 5 896 1565 |
| 6 2493 184 |
| 7 212 3210 |
| 8 727 1339 |
| 9 3428 612 |
| 0 2663 1947 |
| 1 230 2695 |
| 2 2025 2794 |
| 3 3039 283 |
| 4 862 2889 |
| 5 376 2110 |
| 6 2034 2286 |
| 7 951 2068 |
| 8 3108 3542 |
| 9 307 1421 |
| 0 2272 1197 |
| 1 1800 3280 |
| 2 331 2308 |
| 3 465 2552 |
| 4 1038 2479 |
| 5 1383 343 |
| 6 94 236 |
| 7 2619 121 |
| 8 1497 2774 |
| 9 2116 1855 |
| 0 722 1584 |
| 1 2767 1881 |
| 2 2701 1610 |
| 3 3283 1732 |
| 4 168 1099 |
| 5 3074 243 |
| 6 3460 945 |
| 7 2049 1746 |
| 8 566 1427 |
| 9 3545 1168 |

| Address of Parity Bit Accumulators (Rate 5/6) |
|---|
| 3 2409 499 1481 908 559 716 1270 333 2508 2264 1702 2805 |
| 4 2447 1926 |
| 5 414 1224 |
| 6 2114 842 |
| 7 212 573 |
| 0 2383 2112 |
| 1 2286 2348 |
| 2 545 819 |
| 3 1264 143 |
| 4 1701 2258 |
| 5 964 166 |
| 6 114 2413 |
| 7 2243 81 |
| 0 1245 1581 |
| 1 775 169 |
| 2 1696 1104 |
| 3 1914 2831 |
| 4 532 1450 |
| 5 91 974 |
| 6 497 2228 |
| 7 2326 1579 |
| 0 2482 256 |
| 1 1117 1261 |
| 2 1257 1658 |
| 3 1478 1225 |
| 4 2511 980 |
| 5 2320 2675 |
| 6 435 1278 |
| 7 228 503 |
| 0 1885 2369 |
| 1 57 483 |
| 2 838 1050 |
| 3 1231 1990 |
| 4 1738 68 |
| 5 2392 951 |
| 6 163 645 |
| 7 2644 1704 |

| Address of Parity Bit Accumulators (Rate 8/9) |
|---|
| 0 1558 712 805 |
| 1 1450 873 1337 |
| 2 1741 1129 1184 |
| 3 294 806 1566 |
| 4 482 605 923 |
| 0 926 1578 |
| 1 777 1374 |
| 2 608 151 |
| 3 1195 210 |
| 4 1484 692 |
| 0 427 488 |
| 1 828 1124 |
| 2 874 1366 |
| 3 1500 835 |
| 4 1496 502 |
| 0 1006 1701 |
| 1 1155 97 |
| 2 657 1403 |
| 3 1453 624 |
| 4 429 1495 |
| 0 809 385 |
| 1 367 151 |
| 2 1323 202 |
| 3 960 318 |
| 4 1451 1039 |
| 0 1098 1722 |
| 1 1015 1428 |
| 2 1261 1564 |
| 3 544 1190 |
| 4 1472 1246 |
| 0 508 630 |
| 1 421 1704 |

| Address of Parity Bit Accumulators (Rate 8/9) |
|---|
| 2 284 898 |
| 3 392 577 |
| 4 1155 556 |
| 0 631 1000 |
| 1 732 1368 |
| 2 1328 329 |
| 3 1515 506 |
| 4 1104 1172 |

| Address of Parity Bit Accumulators (Rate 1/3) |
|---|
| 416 8909 4156 3216 3112 2560 2912 6405 8593 4969 6723 6912 |
| 8978 3011 4339 9312 6396 2957 7288 5485 6031 10218 2226 3575 |
| 3383 10059 1114 10008 10147 9384 4290 434 5139 3536 1965 2291 |
| 2797 3693 7615 7077 743 1941 8716 6215 3840 5140 4582 5420 |
| 6110 8551 1515 7404 4879 4946 5383 1831 3441 9569 10472 4306 |
| 1505 5682 7778 |
| 7172 6830 6623 |
| 7281 3941 3505 |
| 10270 8669 914 |
| 3622 7563 9388 |
| 9930 5058 4554 |
| 4844 9609 2707 |
| 6883 3237 1714 |
| 4768 3878 10017 |
| 10127 3334 8267 |

| Address of Parity Bit Accumulators (Rate 1/4, Shortened from Rate 1/5) |
|---|
| 6295 9626 304 7695 4839 4936 1660 144 11203 5567 6347 12557 |
| 10691 4988 3859 3734 3071 3494 7687 10313 5964 8069 8296 11090 |
| 10774 3613 5208 11177 7676 3549 8746 6583 7239 12265 2674 4292 |
| 11869 3708 5981 8718 4908 10650 6805 3334 2627 10461 9285 11120 |
| 7844 3079 10773 |
| 3385 10854 5747 |
| 1360 12010 12202 |
| 6189 4241 2343 |
| 9840 12726 4977 |

| Address of Parity Bit Accumulators (Rate 2/5) |
|---|
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660. |

13. A method according to claim 12, wherein the coded signal includes an outer code that is based on Bose Chaudhuri Hocquenghem (BCH) codes and includes cyclic redundancy check (CRC) codes.

14. A method according to claim 13, wherein the BCH codes are generated according to the following polynomial:

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}.$ |

15. A method according to claim 12, further comprising:
demodulating the coded signal using one of 8-PSK (Phase Shift Keying), 16-QAM (Quadrature Amplitude Modulation), QPSK (Quadrature Phase Shift Keying), 16-APSK (Amplitude Phase Shift Keying) or 32-APSK.

16. A method according to claim 12, further comprising:
de-interleaving the coded signal according to the following table:

Bit Interleaver Structure

| Modulation | Rows (for $n_{ldpc}$ = 16200) | Columns |
|---|---|---|
| 8-PSK | 5400 | 3 |
| 16-APSK | 4050 | 4 |
| 32-APSK | 3240 | 5. |

17. An apparatus comprising:
logic configured to receive an Low Density Parity Check (LDPC) coded signal and to decode the signal by accessing edge values to satisfy parity check equations relating to LPDC codes of 16200 bits in length and corresponding to one of a plurality of code rates associated with respective tables each specifying address of parity bit accumulators, Address of Parity Bit Accumulators (Rate ½)

20 712 2386 6354 4061 1062 5045 5158
21 2543 5748 4822 2348 3089 6328 5876
22 926 5701 269 3693 2438 3190 3507
23 2802 4520 3577 5324 1091 4667 4449
24 5140 2003 1263 4742 6497 1185 6202
0 4046 6934
1 2855 66
2 6694 212
3 3439 1158
4 3850 4422
5 5924 290
6 1467 4049
7 7820 2242
8 4606 3080
9 4633 7877
10 3884 6868
11 8935 4996
12 3028 764

-continued

Address of Parity Bit Accumulators (Rate ½)

13 5988 1057
14 7411 3450

Address of Parity Bit Accumulators (Rate ⅗)

2765 5713 6426 3596 1374 4811 2182 544 3394 2840 4310 771
4951 211 2208 723 1246 2928 398 5739 265 5601 5993 2615
210 4730 5777 3096 4282 6238 4939 1119 6463 5298 6320 4016
4167 2063 4757 3157 5664 3956 6045 563 4284 2441 3412 6334
4201 2428 4474 59 1721 736 2997 428 3807 1513 4732 6195
2670 3081 5139 3736 1999 5889 4362 3806 4534 5409 6384 5809
5516 1622 2906 3285 1257 5797 3816 817 875 2311 3543 1205
4244 2184 5415 1705 5642 4886 2333 287 1848 1121 3595 6022
2142 2830 4069 5654 1295 2951 3919 1356 884 1786 396 4738
0 2161 2653
1 1380 1461
2 2502 3707
3 3971 1057
4 5985 6062
5 1733 6028
6 3786 1936
7 4292 956
8 5692 3417
9 266 4878
10 4913 3247
11 4763 3937
12 3590 2903
13 2566 4215
14 5208 4707
15 3940 3388
16 5109 4556
17 4908 4177

Address of Parity Bit Accumulators (Rate ⅔)

0 2084 1613 1548 1286 1460 3196 4297 2481 3369 3451 4620 2622
1 122 1516 3448 2880 1407 1847 3799 3529 373 971 4358 3108
2 259 3399 929 2650 864 3996 3833 107 5287 164 3125 2350
3 342 3529
4 4198 2147
5 1880 4836
6 3864 4910
7 243 1542
8 3011 1436
9 2167 2512
10 4606 1003
11 2835 705
12 3426 2365
13 3848 2474
14 1360 1743
0 163 2536
1 2583 1180
2 1542 509
3 4418 1005
4 5212 5117
5 2155 2922
6 347 2696
7 226 4296
8 1560 487
9 3926 1640
10 149 2928
11 2364 563
12 635 688
13 231 1684
14 1129 3894

| Address of Parity Bit Accumulators (Rate 3/4) |
| --- |
| 3 3198 478 4207 1481 1009 2616 1924 3437 554 683 1801 |
| 4 2681 2135 |
| 5 3107 4027 |
| 6 2637 3373 |
| 7 3830 3449 |
| 8 4129 2060 |
| 9 4184 2742 |
| 10 3946 1070 |
| 11 2239 984 |
| 0 1458 3031 |
| 1 3003 1328 |
| 2 1137 1716 |
| 3 132 3725 |
| 4 1817 638 |
| 5 1774 3447 |
| 6 3632 1257 |
| 7 542 3694 |
| 8 1015 1945 |
| 9 1948 412 |
| 10 995 2238 |
| 11 4141 1907 |
| 0 2480 3079 |
| 1 3021 1088 |
| 2 713 1379 |
| 3 997 3903 |
| 4 2323 3361 |
| 5 1110 986 |
| 6 2532 142 |
| 7 1690 2405 |
| 8 1298 1881 |
| 9 615 174 |
| 10 1648 3112 |
| 11 1415 2808 |

| Address of Parity Bit Accumulators (Rate 4/5) |
| --- |
| 5 896 1565 |
| 6 2493 184 |
| 7 212 3210 |
| 8 727 1339 |
| 9 3428 612 |
| 0 2663 1947 |
| 1 230 2695 |
| 2 2025 2794 |
| 3 3039 283 |
| 4 862 2889 |
| 5 376 2110 |
| 6 2034 2286 |
| 7 951 2068 |
| 8 3108 3542 |
| 9 307 1421 |
| 0 2272 1197 |
| 1 1800 3280 |
| 2 331 2308 |
| 3 465 2552 |
| 4 1038 2479 |
| 5 1383 343 |
| 6 94 236 |
| 7 2619 121 |
| 8 1497 2774 |
| 9 2116 1855 |
| 0 722 1584 |
| 1 2767 1881 |
| 2 2701 1610 |
| 3 3283 1732 |
| 4 168 1099 |
| 5 3074 243 |
| 6 3460 945 |
| 7 2049 1746 |
| 8 566 1427 |
| 9 3545 1168 |

| Address of Parity Bit Accumulators (Rate 5/6) |
| --- |
| 3 2409 499 1481 908 559 716 1270 333 2508 2264 1702 2805 |
| 4 2447 1926 |
| 5 414 1224 |
| 6 2114 842 |
| 7 212 573 |
| 0 2383 2112 |
| 1 2286 2348 |
| 2 545 819 |
| 3 1264 143 |
| 4 1701 2258 |
| 5 964 166 |
| 6 114 2413 |
| 7 2243 81 |
| 0 1245 1581 |
| 1 775 169 |
| 2 1696 1104 |
| 3 1914 2831 |
| 4 532 1450 |
| 5 91 974 |
| 6 497 2228 |
| 7 2326 1579 |
| 0 2482 256 |
| 1 1117 1261 |
| 2 1257 1658 |
| 3 1478 1225 |
| 4 2511 980 |
| 5 2320 2675 |
| 6 435 1278 |
| 7 228 503 |
| 0 1885 2369 |
| 1 57 483 |
| 2 838 1050 |
| 3 1231 1990 |
| 4 1738 68 |
| 5 2392 951 |
| 6 163 645 |
| 7 2644 1704 |

| Address of Parity Bit Accumulators (Rate 8/9) |
| --- |
| 0 1558 712 805 |
| 1 1450 873 1337 |
| 2 1741 1129 1184 |
| 3 294 806 1566 |
| 4 482 605 923 |
| 0 926 1578 |
| 1 777 1374 |
| 2 608 151 |
| 3 1195 210 |
| 4 1484 692 |
| 0 427 488 |
| 1 828 1124 |
| 2 874 1366 |
| 3 1500 835 |
| 4 1496 502 |
| 0 1006 1701 |
| 1 1155 97 |
| 2 657 1403 |
| 3 1453 624 |
| 4 429 1495 |
| 0 809 385 |
| 1 367 151 |
| 2 1323 202 |
| 3 960 318 |
| 4 1451 1039 |
| 0 1098 1722 |
| 1 1015 1428 |
| 2 1261 1564 |
| 3 544 1190 |
| 4 1472 1246 |
| 0 508 630 |
| 1 421 1704 |

-continued

| Address of Parity Bit Accumulators (Rate 8/9) |
|---|
| 2 284 898 |
| 3 392 577 |
| 4 1155 556 |
| 0 631 1000 |
| 1 732 1368 |
| 2 1328 329 |
| 3 1515 506 |
| 4 1104 1172 |

| Address of Parity Bit Accumulators (Rate 1/3) |
|---|
| 416 8909 4156 3216 3112 2560 2912 6405 8593 4969 6723 6912 |
| 8978 3011 4339 9312 6396 2957 7288 5485 6031 10218 2226 3575 |
| 3383 10059 1114 10008 10147 9384 4290 434 5139 3536 1965 2291 |
| 2797 3693 7615 7077 743 1941 8716 6215 3840 5140 4582 5420 |
| 6110 8551 1515 7404 4879 4946 5383 1831 3441 9569 10472 4306 |
| 1505 5682 7778 |
| 7172 6830 6623 |
| 7281 3941 3505 |
| 10270 8669 914 |
| 3622 7563 9388 |
| 9930 5058 4554 |
| 4844 9609 2707 |
| 6883 3237 1714 |
| 4768 3878 10017 |
| 10127 3334 8267 |

| Address of Parity Bit Accumulators (Rate 1/4, Shortened from Rate 1/3) |
|---|
| 6295 9626 304 7695 4839 4936 1660 144 11203 5567 6347 12557 |
| 10691 4988 3859 3734 3071 3494 7687 10313 5964 8069 8296 11090 |
| 10774 3613 5208 11177 7676 3549 8746 6583 7239 12265 2674 4292 |
| 11869 3708 5981 8718 4908 10650 6805 3334 2627 10461 9285 11120 |
| 7844 3079 10773 |
| 3385 10854 5747 |
| 1360 12010 12202 |
| 6189 4241 2343 |
| 9840 12726 4977 |

| Address of Parity Bit Accumulators (Rate 2/5) |
|---|
| 5650 4143 8750 583 6720 8071 635 1767 1344 6922 738 6658 |
| 5696 1685 3207 415 7019 5023 5608 2605 857 6915 1770 8016 |
| 3992 771 2190 7258 8970 7792 1802 1866 6137 8841 886 1931 |
| 4108 3781 7577 6810 9322 8226 5396 5867 4428 8827 7766 2254 |
| 4247 888 4367 8821 9660 324 5864 4774 227 7889 6405 8963 |
| 9693 500 2520 2227 1811 9330 1928 5140 4030 4824 806 3134 |
| 1652 8171 1435 |
| 3366 6543 3745 |
| 9286 8509 4645 |
| 7397 5790 8972 |

-continued

| Address of Parity Bit Accumulators (Rate 2/3) |
|---|
| 6597 4422 1799 |
| 9276 4041 3847 |
| 8683 7378 4946 |
| 5348 1993 9186 |
| 6724 9015 5646 |
| 4502 4439 8474 |
| 5107 7342 9442 |
| 1387 8910 2660. |

18. An apparatus according to claim 17, wherein the coded signal includes an outer code that is based on Bose Chaudhuri Hocquenghem (BCH) codes and includes cyclic redundancy check (CRC) codes.

19. An apparatus according to claim 18, wherein the BCH codes are generated according to the following polynomial:

| | |
|---|---|
| $g_1(x)$ | $1 + x^2 + x^3 + x^5 + x^{16}$ |
| $g_2(x)$ | $1 + x + x^4 + x^5 + x^6 + x^8 + x^{16}$ |
| $g_3(x)$ | $1 + x^2 + x^3 + x^4 + x^5 + x^7 + x^8 + x^9 + x^{10} + x^{11} + x^{16}$ |
| $g_4(x)$ | $1 + x^2 + x^4 + x^6 + x^9 + x^{11} + x^{12} + x^{14} + x^{16}$ |
| $g_5(x)$ | $1 + x + x^2 + x^3 + x^5 + x^8 + x^9 + x^{10} + x^{11} + x^{12} + x^{16}$ |
| $g_6(x)$ | $1 + x^2 + x^4 + x^5 + x^7 + x^8 + x^9 + x^{10} + x^{12} + x^{13} + x^{14} + x^{15} + x^{16}$ |
| $g_7(x)$ | $1 + x^2 + x^5 + x^6 + x^8 + x^9 + x^{10} + x^{11} + x^{13} + x^{15} + x^{16}$ |
| $g_8(x)$ | $1 + x + x^2 + x^5 + x^6 + x^8 + x^9 + x^{12} + x^{13} + x^{14} + x^{16}$ |
| $g_9(x)$ | $1 + x^5 + x^7 + x^9 + x^{10} + x^{11} + x^{16}$ |
| $g_{10}(x)$ | $1 + x + x^2 + x^5 + x^7 + x^8 + x^{10} + x^{12} + x^{13} + x^{14} + x^{16}$ |
| $g_{11}(x)$ | $1 + x^2 + x^3 + x^5 + x^9 + x^{11} + x^{12} + x^{13} + x^{16}$ |
| $g_{12}(x)$ | $1 + x + x^5 + x^6 + x^7 + x^9 + x^{11} + x^{12} + x^{16}$. |

20. An apparatus according to claim 17, further comprising:
a demodulator circuit configured to demodulate the coded signal using one of 8-PSK (Phase Shift Keying), 16-QAM (Quadrature Amplitude Modulation), QPSK (Quadrature Phase Shift Keying), 16-APSK (Amplitude Phase Shift Keying) or 32-APSK.

21. An apparatus according to claim 17, further comprising:
de-interleaver circuit configured to de-interleave the coded signal according to the following table:

| Bit interleaver Structure | | |
|---|---|---|
| Modulation | Rows (for $n_{ldpc}$ = 16200) | Columns |
| 8-PSK | 5400 | 3 |
| 16-APSK | 4050 | 4 |
| 32-APSK | 3240 | 5. |

* * * * *